United States Patent
Ainspan et al.

(10) Patent No.: US 9,325,332 B2
(45) Date of Patent: Apr. 26, 2016

(54) ADJUSTING THE MAGNITUDE OF A CAPACITANCE OF A DIGITALLY CONTROLLED CIRCUIT

(71) Applicant: International Business Machines Corporation, Armonk, NY (US)

(72) Inventors: Herschel A. Ainspan, New Hempstead, NY (US); Mark A. Ferriss, Tarrytown, NY (US); Daniel J. Friedman, Sleepy Hollow, NY (US); Alexander V. Rylyakov, Mount Kisco, NY (US); Bodhisatwa Sadhu, White Plains, NY (US); Alberto Valdes-Garcia, Chappaqua, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/617,507

(22) Filed: Feb. 9, 2015

(65) Prior Publication Data

US 2016/0065227 A1 Mar. 3, 2016

Related U.S. Application Data

(60) Provisional application No. 62/042,376, filed on Aug. 27, 2014.

(51) Int. Cl.
*H03B 5/08* (2006.01)
*H03L 7/099* (2006.01)
(Continued)

(52) U.S. Cl.
CPC ............... *H03L 7/0992* (2013.01); *H03B 1/00* (2013.01); *H03B 5/1212* (2013.01); *H03B 5/1265* (2013.01); *H03H 11/04* (2013.01); *H03L 7/093* (2013.01)

(58) Field of Classification Search
CPC ...... H03B 1/00; H03B 5/1212; H03B 5/1265; H03L 7/0992; H03L 7/093; H03H 11/04
USPC .............. 331/167, 177 V, 117 R, 117 FE, 34, 331/177 R; 334/78
See application file for complete search history.

(56) References Cited

U.S. PATENT DOCUMENTS

| 5,844,448 A | 12/1998 | Jackoski et al. |
| 7,336,134 B1 | 2/2008 | Janesch et al. |

(Continued)

FOREIGN PATENT DOCUMENTS

JP 2009296375 A 12/2009

OTHER PUBLICATIONS

R.B. Staszewski et al., "A First Multigigahertz Digitally Controlled Oscillator for Wireless Applications," IEEE Transactions on Microwave Theory and Techniques, Nov. 2003, pp. 2154-2164, vol. 51, No. 11.

(Continued)

*Primary Examiner* — Arnold Kinkead
(74) *Attorney, Agent, or Firm* — Vazken Alexanian; Ryan, Mason & Lewis, LLP

(57) ABSTRACT

An apparatus comprises a digitally controlled circuit having a variable capacitance and a controller configured to adjust a magnitude of the variable capacitance of the digitally controlled circuit. The digitally controlled circuit comprises a plurality of gain elements, the plurality of gain elements comprising one or more positive voltage-to-frequency gain elements and one or more negative voltage-to-frequency gain elements. The controller is configured to adjust the magnitude of the capacitance by adjusting the gain provided by respective ones of the gain elements in an alternating sequence of the positive voltage-to-frequency gain elements and the negative voltage-to-frequency gain elements.

18 Claims, 14 Drawing Sheets

(51) Int. Cl.
  *H03L 7/093* (2006.01)
  *H03B 5/12* (2006.01)
  *H03H 11/04* (2006.01)
  *H03B 1/00* (2006.01)

(56) References Cited

U.S. PATENT DOCUMENTS

| | | | |
|---|---|---|---|
| 7,675,373 | B2 | 3/2010 | Thaller |
| 8,299,862 | B1 * | 10/2012 | De Bernardinis .... H03B 5/1228 331/117 FE |
| 2008/0265998 | A1 | 10/2008 | Wood |
| 2009/0085681 | A1 | 4/2009 | Lin et al. |
| 2013/0107978 | A1 | 5/2013 | Thaller et al. |

OTHER PUBLICATIONS

J.H. Han et al., "Digitally Controlled Oscillator with High Frequency Resolution Using Novel Varactor Bank," Electronics Letters, Dec. 2008, pp. 1450-1452, vol. 44, No. 25.

A. Swaminathan et al., "A Wide-Bandwith 2.4 GHz ISM Band Fractional-N PLL With Adaptive Phase Noise Cancellation," IEEE Journal of Solid-State Circuits,Dec. 2007, pp. 2639-2650, vol. 42, No. 12.

M. Ferriss et al., "A 28GHz Hybrid PLL in 32nm SOI CMOS," IEEE Journal of Solid-State Circuits, Apr. 2014, pp. 1027-1035, vol. 49, No. 4.

M.A. Ferriss et al., "A 14 mW Fractional-N PLL Modulator With a Digital Phase Detector and Frequency Switching Scheme," IEEE Journal of Solid-State Circuits, Nov. 2008, pp. 2464-2471, vol. 43, No. 11.

D. Tasca et al., "A 2.9-4.0-GHz Fractional-N Digital PLL With Bang-Bang Phase Detector and 560-fsrms Integrated Jitter at 4.5-mW Power," IEEE Journal of Solid-State Circuits, Dec. 2011, pp. 2745-2758, vol. 46, No. 12.

R.B. Staszewski et al., "All-Digital PLL and Transmitter for Mobile Phones," IEEE Journal of Solid-State Circuits, Dec. 2005, pp. 2469-2482, vol. 40, No. 12.

* cited by examiner $sw_2$ TO $sw_{127}$ $sw_2$ TO $sw_{127}$

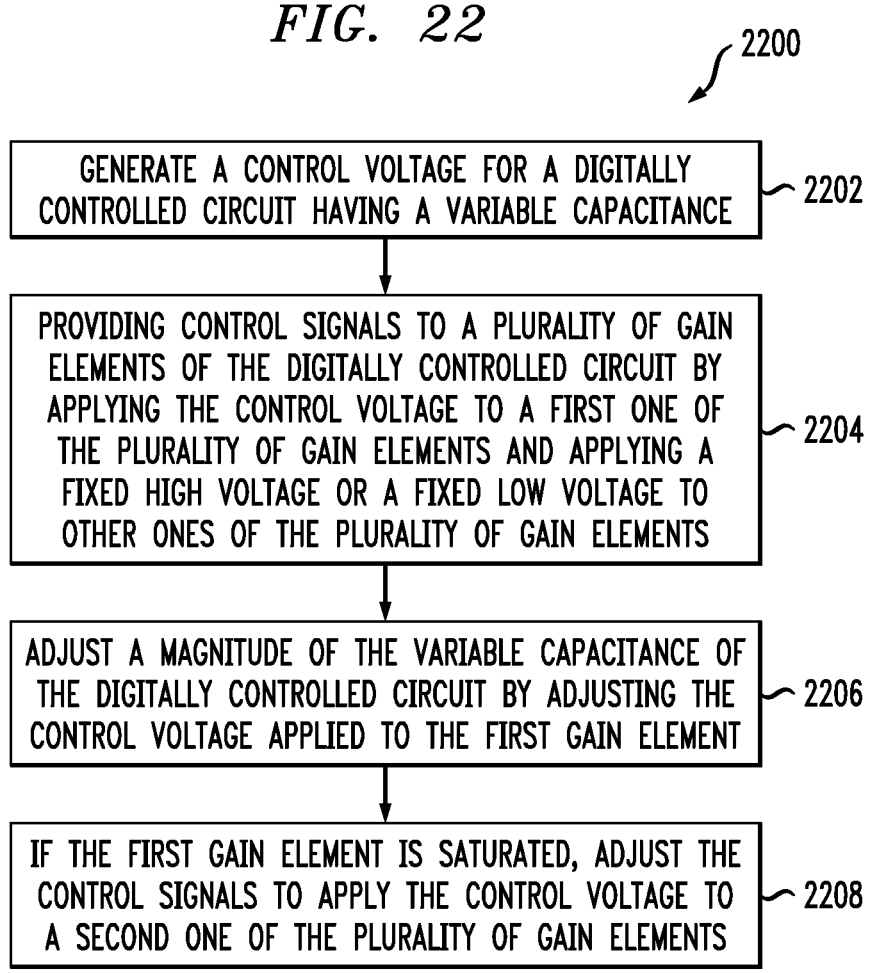
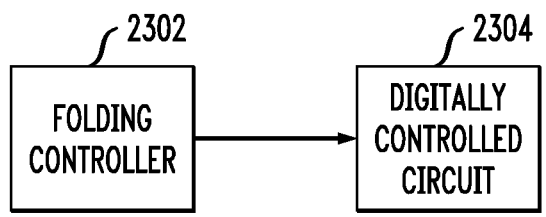

ADJUSTING THE MAGNITUDE OF A CAPACITANCE OF A DIGITALLY CONTROLLED CIRCUIT

CROSS-REFERENCE TO RELATED APPLICATION

This application claims the priority of U.S. Provisional Patent Application Ser. No. 62/042,376, filed on Aug. 27, 2014, the disclosure of which is fully incorporated by reference herein.

STATEMENT REGARDING FEDERALLY SPONSORED RESEARCH

This invention was made with Government support under Contract No.: HR0011-12-C-0087 awarded by the Defense Advanced Research Projects Agency (DARPA). The Government has certain rights in this invention.

FIELD OF THE INVENTION

The present application relates generally to oscillators and, more particularly to control of an oscillator's frequency.

BACKGROUND

Oscillators are used in various circuits, integrated circuits (chips), and systems. Oscillators often include an inductor, a capacitor, a negative resistance element to maintain oscillation and a variable capacitor or varactor for controlling the frequency of the oscillator. An oscillator controlled with a digital control word is referred to as a digitally controlled oscillator (DCO). An oscillator controlled with an analog control voltage is referred to as a voltage controlled oscillator (VCO).

SUMMARY

Embodiments of the invention provide techniques for controlling an oscillator's frequency.

In one embodiment, an apparatus comprises a digitally controlled circuit having a variable capacitance and a controller configured to adjust a magnitude of the variable capacitance of the digitally controlled circuit. The digitally controlled circuit comprises a plurality of gain elements, the plurality of gain elements comprising one or more positive voltage-to-frequency gain elements and one or more negative voltage-to-frequency gain elements. The controller is configured to adjust the magnitude of the capacitance by adjusting the gain provided by respective ones of the gain elements in an alternating sequence of the positive voltage-to-frequency gain elements and the negative voltage-to-frequency gain elements.

In another embodiment, a phase-locked loop comprises a phase detector, a filter having at least one input coupled to at least one output of the phase detector, a controller having at least one input coupled to at least one output of the filter, an oscillator having a variable capacitance, the oscillator having at least one input coupled to at least one output of the controller, and a divider having at least one input coupled to at least one output of the oscillator and at least one output coupled to at least one input of the phase detector. The oscillator comprises a plurality of gain elements, the plurality of gain elements comprising one or more positive voltage-to-frequency gain elements and one or more negative voltage-to-frequency gain elements. The controller is configured to adjust the magnitude of the capacitance by adjusting the gain provided by respective ones of the gain elements in an alternating sequence of the positive voltage-to-frequency gain elements and the negative voltage-to-frequency gain elements.

In another embodiment, a method comprises generating a control voltage for a digitally controlled circuit having a variable capacitance, the digitally controlled circuit comprising a plurality of gain elements, providing control signals to the plurality of gain elements by applying the control voltage to a first one of the plurality of gain elements and applying a fixed high voltage or a fixed low voltage to other ones of the plurality of gain elements, and adjusting a magnitude of the variable capacitance of the digitally controlled circuit by adjusting the control voltage applied to the first gain element and, if the first gain element is saturated, adjusting the control signals to apply the fixed high voltage or the fixed low voltage to the first gain element and to apply the control voltage to a second one of the plurality of gain elements. The first gain element comprises one of a positive voltage-to-frequency gain element and a negative voltage-to-frequency gain element and the second gain element comprises the other one of a positive voltage-to-frequency gain element and a negative voltage-to-frequency gain element.

These and other features, objects and advantages of the present invention will become apparent from the following detailed description of illustrative embodiments thereof, which is to be read in connection with the accompanying drawings.

BRIEF DESCRIPTION OF THE DRAWINGS

FIG. 22 shows a method for controlling a digitally controlled circuit, according to an embodiment of the invention.

FIG. 23 shows a digitally controlled circuit, according to an embodiment of the invention.

DETAILED DESCRIPTION

Figure 1:
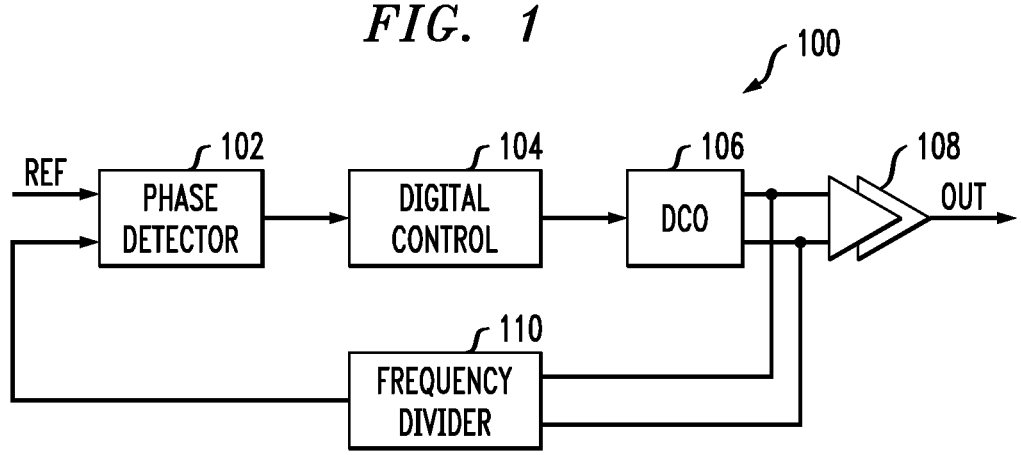
FIG. 1 shows a digital phase-locked loop (PLL) architecture, according to an embodiment of the invention.

Illustrative embodiments of the invention will be described herein in the context of oscillators used in circuits such as PLLs. However, it is to be understood that principles of the invention are not limited solely to the specific architectures described herein. For example, the inventive techniques can be used in a number of other types of circuits including microprocessors, mm-wave radios, serial links, etc.

Various embodiments provide for controlling the magnitude of a capacitance of a digitally controlled circuit using a "folding" structure. While the folding structure is described below primarily in the context of oscillators and PLLs, embodiments are not so limited. By way of example, the folding control structures described herein may be used in a wide variety of other types of digitally controlled circuits, including by way of example filters.

Digital PLLs having low noise and a wide tuning range are desired for various applications. The digital control mechanism of an oscillator in a digital PLL is a barrier towards building a digital PLL having low noise and a wide tuning range.

A high performance, low noise integrated oscillator includes an inductor, a capacitor and a negative resistance element for maintaining oscillation, along with a variable capacitor for controlling the frequency of the oscillator. DCO architectures may include a DAC used in conjunction with a varactor to form the DCO. DCO architectures may also use banks of digitally switched varactors, where each varactor is tied to a supply. Existing DCO architectures have significant practical limitations which prevent the implementation of wide tuning range, high frequency, low noise oscillators.

An ideal DCO structure has a number of desired properties. One desired property is that only a small number of low gain varactors, for example two, should be active at a given time without limiting the total tuning range of the DCO. A large bank of low gain varactors can be used for a required tuning range, provided that at any given time most of the varactors are saturated high or low. Another desired property is that the DCO architecture should use low resolution DACs, such as DACs at or below an 8-bit level. Higher resolution DACs may be used, but power and area are compromised when using higher resolution DACs. With regard to the varactors in the DCO architecture, there are several desired properties. For example, there should be no matching requirements between varactors and no simultaneous switching of capacitors that are required to match. There should also be no large signal switching of varactor control voltages. The DCO structure should also have an overall digital-to-frequency gain that is reasonably linear, even if the varactors used in the DCO architecture have low gain regions at the edge of their respective ranges.

Embodiments of the invention can meet all of the above requirements simultaneously, overcoming various disadvantages of existing DCO architectures which are unable to do so. It is important to note, however, that embodiments are not limited solely to DCO architectures which simultaneously meet all of the above requirements.

FIG. 1 shows a digital PLL 100. The digital PLL 100 includes a phase detector 102, digital control 104, DCO 106, driver 108 and frequency divider 110. The phase detector 102 detects a phase difference between a reference signal, denoted Ref in FIG. 1 and the output of the frequency divider 110. The frequency divider 110 divides the output frequency of the DCO 106 to provide frequency scaling. The output of the phase detector 102 is input to digital control 104, which controls the DCO 106 so as to match the divided output of the DCO 106 with the reference signal Ref.

Figure 2:
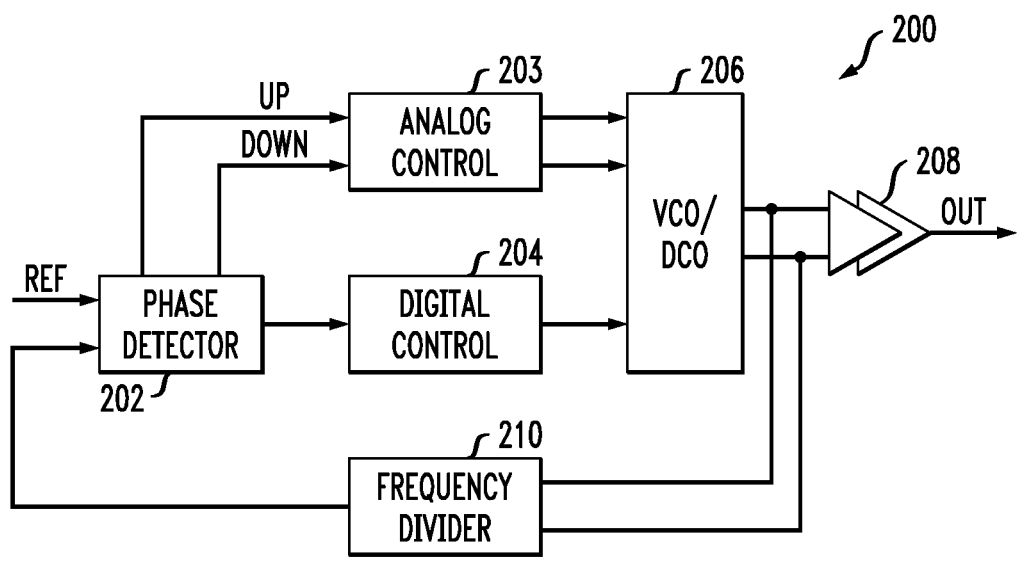
FIG. 2 shows a hybrid PLL architecture, according to an embodiment of the invention.

FIG. 2 shows a hybrid PLL 200. The hybrid PLL 200 includes phase detector 202, analog control 203, digital control 204, VCO/DCO 206, driver 208 and frequency divider 210. The phase detector 202 detects a phase difference between the output of the frequency divider 210 and the reference signal Ref. The phase detector 202 in the hybrid PLL 200 provides outputs to both analog control 203 and digital control 204. Analog control 203 controls the VCO portion of VCO/DCO 206 while the digital control 204 controls the DCO portion of VCO/DCO 106. The hybrid PLL 200 may be an integer-N hybrid PLL or a fractional-N hybrid PLL.

In some embodiments an apparatus includes an oscillator, such as DCO 106 or VCO/DCO 206, having a variable capacitance. The oscillator comprises a plurality of gain elements, including one or more positive voltage-to-frequency gain elements and one or more negative voltage-to-frequency gain elements. A controller is used to adjust the magnitude of the variable capacitance of the oscillator by adjusting control signals for respective ones of the gain elements. The gain elements are controlled in an alternating sequence of the positive voltage-to-frequency gain elements and the negative voltage-to-frequency gain elements as will be detailed below. In other words, neighboring control elements in the control sequence include one positive voltage-to-frequency gain element and one negative voltage-to-frequency gain element.

In some embodiments, the apparatus also includes a DAC providing a DAC control voltage responsive to control codes supplied by a controller such as digital control 104 or digital control 204. A plurality of switches are configured to select one of the DAC control voltage, a fixed high voltage and a fixed low voltage to apply to corresponding ones of the gain elements responsive to control signals provided by the controller. In some embodiments described below, the fixed high voltage is a positive supply voltage VDD while the fixed low voltage is a ground voltage. Embodiments, however, are not limited solely to use with VDD and ground voltages. The controller provides the control signals such that one of the gain elements is supplied with the DAC control voltage while other ones of the gain elements are supplied with the supply or ground voltage.

In other embodiments, the gain elements are arranged into multiple banks of gain elements connected in parallel, and controlled in sequence. For example, consider two banks of gain elements where the control signals for gain elements in one of the banks are offset from control signals for gain elements in the other one of the banks. The control signals in the banks may be offset by half a range of a single one of the gain elements, as will be described in further detail below. In embodiments with multiple banks of gain elements, each bank may have its own DAC. Continuing with the two bank example, a first DAC provides a first DAC control voltage and a second DAC provides a second DAC control voltage. The controller provides control signals to the first and second banks such that one gain element in the first bank is supplied with the first DAC voltage, one gain element in the second bank is supplied with the second DAC voltage, and other ones of the gain elements in the first and second banks are supplied with one of the positive supply voltage and the ground voltage.

In some embodiments, the DAC or DACs have transfer functions which introduce hysteresis. For example, the transfer function for a DAC may be configured such that the top two control codes produce the same maximum voltage and the bottom two control codes produce the same minimum voltage.

As will be described in detail below, the gain elements may comprise varactors or high-Q switched capacitors, where Q denotes the quality factor. In some embodiments, the oscillator has a bank of two or more digitally switched high-Q capacitors for coarse band tuning of the capacitance of the oscillator, where the gain elements are varactors providing continuous tuning of the capacitance of the oscillator within one of the coarse bands.

The partitioning of a frequency range of a VCO between coarse frequency bands and continuous or analog frequency tuning involves a tradeoff. A small analog tuning range results in a lower voltage-to-frequency gain, less sensitivity to noise, etc. but has a limited frequency range over which a PLL can maintain a lock. A large analog tuning range allows the PLL to maintain lock over a larger frequency range, but also results in higher voltage-to-frequency gain. The additional sensitivity due to the higher voltage-to-frequency gain creates substantial implementation challenges. Embodiments described below provide a tuning scheme that breaks the link between the glitch-free lock range and the requirement for low gain varactors.

Figure 3:
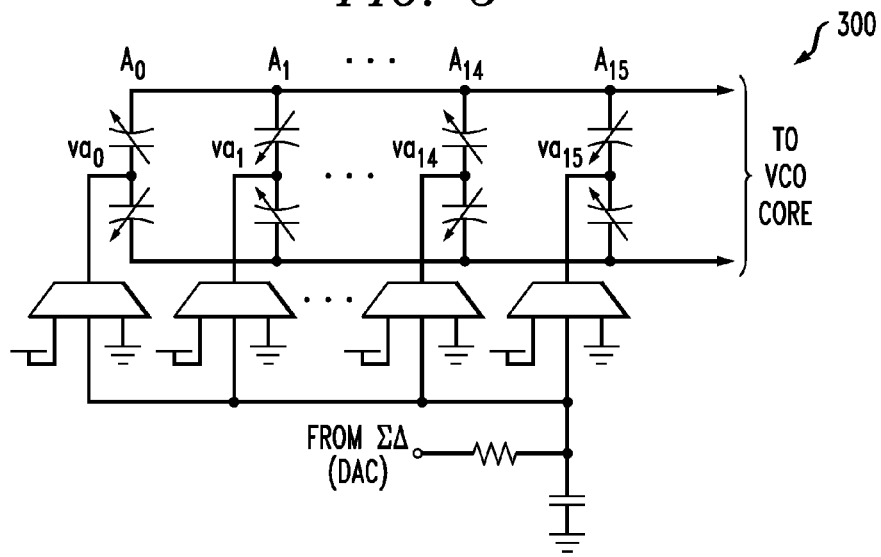
FIG. 3 shows a folding varactor structure, according to an embodiment of the invention.

FIG. 3 shows a folding varactor structure 300. The folding varactor structure 300 may be implemented as part of the DCO 106 in digital PLL 100 or the VCO/DCO 206 in hybrid PLL 200.

The folding varactor structure 300 has a bank of 16 low gain analog varactors, denoted $A_0$ through $A_{15}$ in FIG. 3. The low gain varactors $A_0$ through $A_{15}$ are used in conjunction with a DAC (not shown in FIG. 3) to control the frequency of an oscillator without any matching requirements between the analog varactors and without requiring more than one low gain varactor to be active at any time. The "even" numbered varactors $A_0$, $A_2$, etc. have positive voltage-to-frequency gain, while the "odd" numbered varactors $A_1$, $A_3$, etc. have negative voltage-to-frequency gain. In other embodiments the even numbered varactors may have negative voltage-to-frequency gain while the odd numbered varactors may have positive voltage-to-frequency gain.

Although FIG. 3 shows the even and odd numbered varactors being physically placed next to one another, this is not a requirement. The even numbered varactors and the odd numbered varactors need not be physically placed next to one another, as long as the sequence in which positive voltage-to-frequency varactors and negative voltage-to-frequency varactors are alternately controlled as described herein.

A set of switches, shown as multiplexers in FIG. 3 and control logic (not shown in FIG. 3) connect each varactor to one of the DAC voltage, the positive supply voltage (VDD) or the ground voltage (VSS). The digital control 104 in digital PLL 100 and the digital control 204 in hybrid PLL 200 may implement the control logic for the folding varactor structure 300.

A DAC is used to generate a voltage which is applied to one of the varactors $A_0$ through $A_{15}$. All other ones of the varactors are tied to VDD or VSS, corresponding to their respective saturated, low gain state. As shown in FIG. 3, the voltage from the DAC may be provided by a sigma delta ($\Sigma\Delta$) modulator. The functionality of the DAC and $\Sigma\Delta$ modulator, along with the RC circuit shown after the DAC/$\Sigma\Delta$ modulator signal in the bottom of FIG. 3, will be described in further detail below with respect to FIG. 9.

Consider a DAC voltage currently supplied to a positive voltage-to-frequency gain varactor. If the oscillator frequency is required to increase, the DAC voltage increases until the voltage reaches VDD. Once the DAC voltage corresponding to full scale is detected, the current varactor is disconnected from the DAC and connected to VDD. The DAC is then switched so as to control the next varactor in the bank, which has a negative voltage-to-frequency gain. If the oscillator frequency is required to increase further, the DAC voltage ramps down until it eventually reaches VSS, at which point the negative voltage-to-frequency gain varactor is switched from the DAC control voltage to VSS, and the DAC control voltage is applied to the next varactor in the bank, which is a positive voltage-to-frequency gain varactor. The DAC voltage then ramps up again to increase the oscillator frequency. This process continues through the bank of varactors. If the oscillator frequency is required to decrease, the process is reversed.

Figure 4:
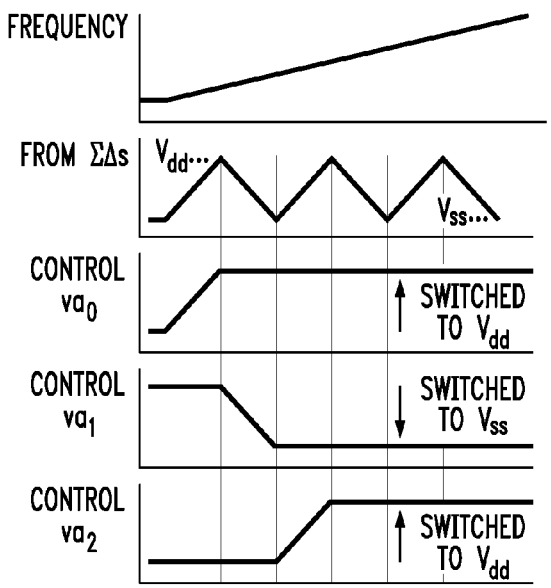
FIG. 4 shows example waveforms for generating a frequency ramp in the folding varactor structure of FIG. 3, according to an embodiment of the invention.

FIG. 4 shows waveforms for generating a frequency ramp in the folding varactor structure 300. To increase the frequency, the voltages from the DAC and $\Sigma\Delta$ modulator ramp up and down between VDD and VSS. Each positive voltage-to-frequency gain varactor is initially supplied VSS, while each negative voltage-to-frequency gain varactor is initially supplied VDD. As shown in the FIG. 4 waveforms, control voltage $va_0$ controlling varactor $A_0$ starts at VSS, control voltage $va_1$ controlling varactor $A_1$ starts at VDD, control voltage $va_2$ controlling varactor $A_2$ starts at VSS, etc. The frequency ramp starts with the DAC control voltage being supplied to varactor $A_0$. The DAC voltage, and thus control $va_0$ ramps up to VDD. Once the DAC voltage reaches VDD, control $va_0$ is switched to VDD and the DAC voltage is supplied to varactor $A_1$. The DAC voltage, and thus the control $va_1$ then ramps down to VSS. On reaching VSS, varactor $A_1$ is switched to VSS and the DAC voltage is supplied to varactor $A_2$. The DAC voltage, and thus the control $va_2$ then ramps back up to VDD at which point the varactor $A_2$ is switched to VDD, and the DAC voltage is supplied to varactor $A_3$. This process continues through varactor $A_{15}$ or until the desired frequency is reached.

It is important to note that although FIG. 3 shows a bank of 16 low gain analog varactors $A_0$ through $A_{15}$, embodiments are not limited solely to having 16 varactors. Embodiments may use more or fewer varactors, or more generally more or fewer gain elements. By way of example, as will be described in further detail below with respect to FIGS. 6 and 7, some embodiments may use multiple banks of analog varactors.

Figure 5:
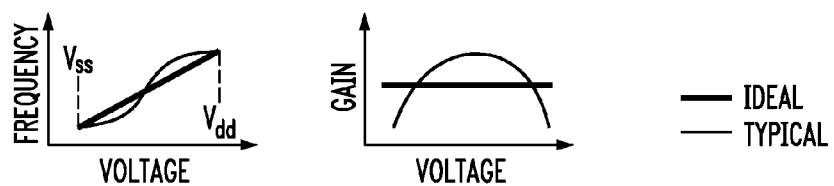
FIG. 5 shows varactor voltage-to-frequency transfer curves, according to an embodiment of the invention.

FIG. 5 shows voltage-to-frequency transfer curves. FIG. 5 shows a frequency-voltage plot and a gain-voltage plot, each showing an ideal transfer function and a typical transfer function. As can be seen, the gain is a non-linear function of the voltage in a typical transfer function. A consequence of this is that the small signal gain can be highly variable. The largest small signal gain typically occurs in the middle of a varactor's tuning range. Changes in the center frequency of an oscillator due to manufacturing variation means that it is difficult to predict which point on the transfer curve will correspond to a given frequency. When a DCO is placed in a PLL system, this gain variability leads to variability in the PLL's characteristics such as the small signal transfer function, phase margin, etc.

Figure 6:
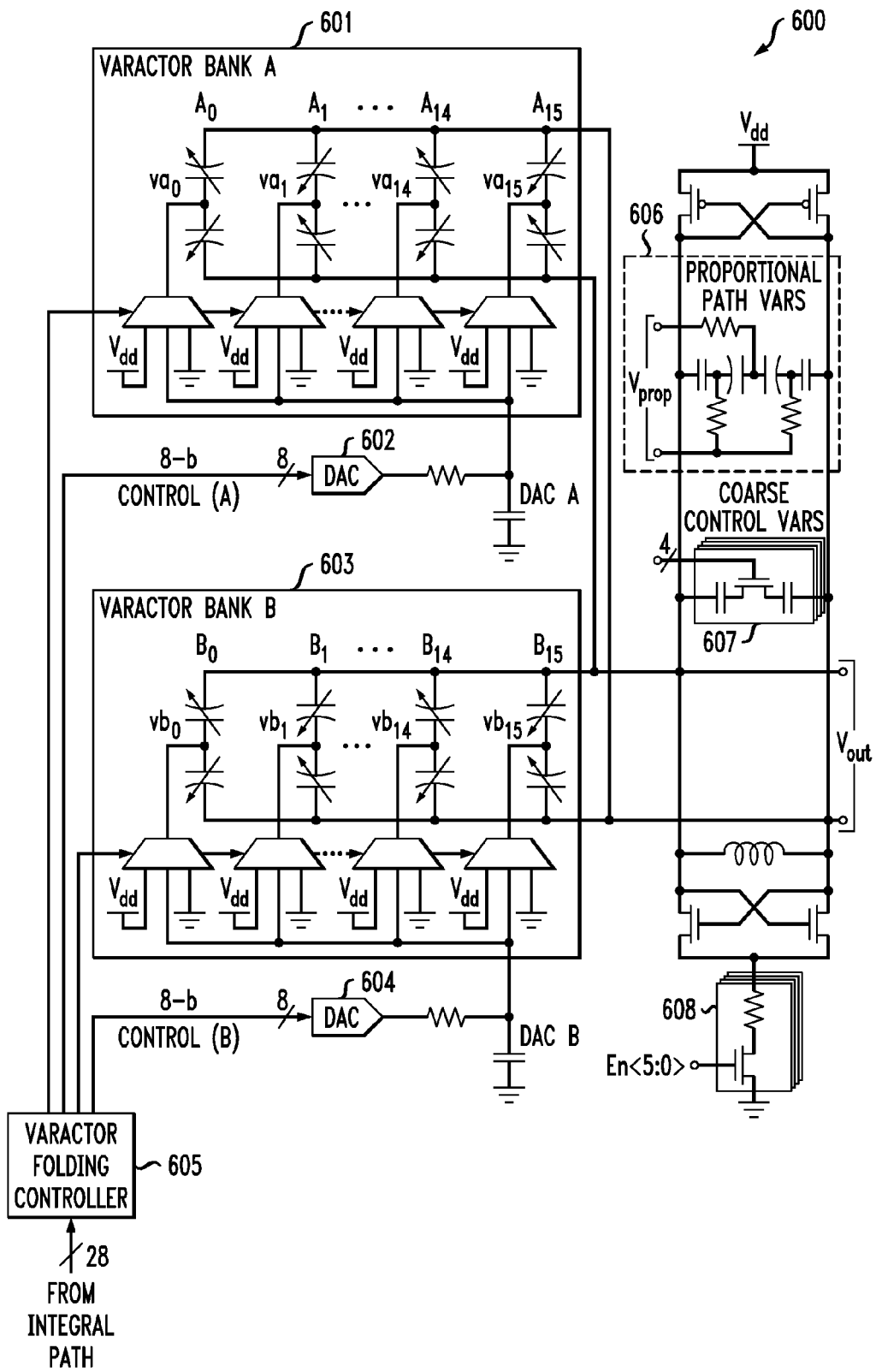
FIG. 6 shows a dual folding varactor structure, according to an embodiment of the invention.

To account for the above-described gain variability, some embodiments utilize multiple banks of gain elements that are simultaneously active but offset from one another. FIG. 6, for example, shows a dual folding varactor structure 600. The dual folding varactor structure shows two banks of varactors, varactor bank A 601 and varactor bank B 603. The varactor bank A 601 has 16 analog varactors denoted $A_0$ through $A_{15}$, and the varactor bank B 603 has 16 analog varactors denoted $B_0$ through $B_{15}$. It is to be appreciated that embodiments are not limited solely to varactor banks containing 16 varactors or more generally gain elements. In addition, embodiments are not limited solely to two varactor banks. The dual varactor folding structure 600, which will be described in further detail below, may be extended to include more than two banks. This can be advantageous in applications where maintaining a linear voltage-to-frequency transfer function is critical.

The dual varactor folding structure 600 includes two DACs. DAC A 602 provides a control word to varactor bank A 601, while DAC B 604 provides a control word to varactor bank B 603. The DACs 602 and 604 are controlled by varactor folding controller 605. The varactor folding controller 605 is an example of the digital control 104 of digital PLL 100 and the digital control 204 of hybrid PLL 200. Similar to the folding varactor structure 300, "even" numbered varactors in each bank, e.g., $A_0$, $A_2$, etc. and $B_0$, $B_2$, etc., have positive voltage-to-frequency gain while the "odd" numbered varactors in each bank, e.g., $A_1$, $A_3$, etc. and $B_1$, $B_3$, etc. have negative voltage-to-frequency gain. Again similar to the varactor structure 300 described above, in other embodiments the even numbered varactors may have negative voltage-to-frequency gain while the odd numbered varactors may have positive voltage-to-frequency gain.

As noted above with respect to FIG. 3, although the even and odd numbered varactors in FIG. 6 are physically placed next to one another, this is not a requirement. The even numbered varactors and the odd numbered varactors need not be physically placed next to one another, as long as the sequence in which positive voltage-to-frequency gain varactors and negative voltage-to-frequency gain varactors are alternately controlled as described herein.

A set of switches, shown in FIG. 6 as multiplexers, are used to connect each varactor in varactor bank A 601 to one of the DAC voltage provided by DAC A 602, VDD or VSS in response to control signals received from varactor folding controller 605. The DAC voltage provided by DAC A 602 is controlled based on the 8-bit control (A) received from varactor folding controller 605. Similarly, a set of switches shown as multiplexers in FIG. 6 are used to connect each varactor in varactor bank B 603 to one of the DAC voltage provided by DAC B 604, VDD or VSS in response to control signals received from varactor folding controller 605. The DAC voltage provided by DAC B 604 is controlled based on the 8-bit control (B) received from varactor folding controller 605. At any given time, one varactor from varactor bank A 601 is connected to the DAC voltage provided by DAC A 602 and one varactor from varactor bank B 603 is connected to the DAC voltage provided by DAC B 604, while the other varactors in varactor bank A 601 and varactor bank B 603 are connected to VDD or VSS. Thus, at any given time there are two active varactors—one from varactor bank A 601 and one from varactor bank B 603.

The control code for varactor bank B 603 is offset from the control code for varactor bank A 601. In some embodiments, the control code for varactor bank B 603 is offset from the control code for varactor bank A 601 by approximately half of the range of a single one of the varactors. More generally, the offset is based on the number of banks of gain elements. For three banks of gain elements, the control codes may be offset by approximately one third of the range of a single one of the varactors.

Due to the control code offset, when the voltage applied to the active varactor in varactor bank A 601 is at the top or bottom of its range, the voltage applied to the active varactor in varactor bank B 603 will be in the middle of its range. The total code-to-frequency gain is the sum of the gain from varactor bank A 601 and varactor bank B 603. When the gain of varactor bank A 601 is very low due to the active varactor voltage being close to saturated at supply or ground, the gain of varactor bank B 603 will be high as the control voltage for the active varactor of varactor bank B 603 will be in the center of its range, and vice versa. Consequently, the gain variation versus frequency illustrated in FIG. 5 is significantly reduced.

Figure 7:
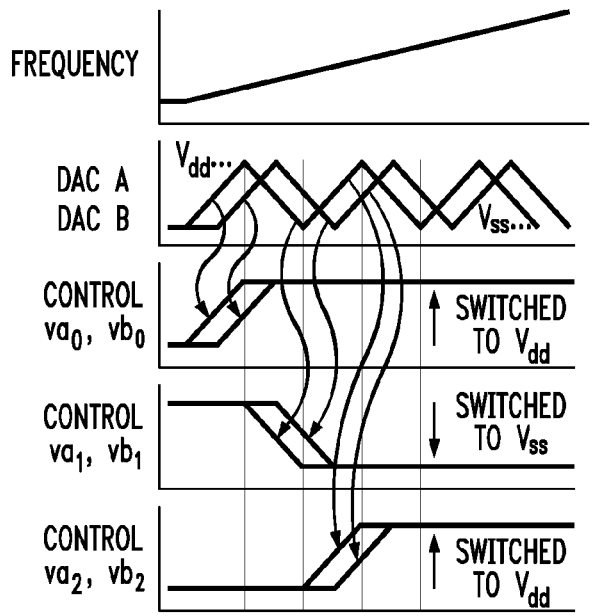
FIG. 7 shows example waveforms for generating a frequency ramp in the dual folding varactor structure of FIG. 6, according to an embodiment of the invention.

FIG. 7 shows waveforms for generating a frequency ramp in the dual folding varactor structure 600. To increase the frequency, the voltages from DAC A 602 and DAC B 604 ramp up and down between VDD and VSS. As shown in FIG. 7, the voltages from DAC A 602 and DAC B 604 and/or corresponding ΣΔ modulators, are offset from one another in the manner described above. Each positive voltage-to-frequency gain varactor is initially supplied VSS, while each negative voltage-to-frequency gain varactor is initially supplied VDD. As shown in the FIG. 7 waveforms, control voltage $va_0$ controlling varactor $A_0$ starts at VSS, control voltage $va_1$ controlling varactor $A_1$ starts at VDD, control voltage $va_2$ controlling varactor $A_2$ starts at VSS, etc. Similarly, control voltage $vb_0$ controlling varactor $B_0$ starts at VSS, control voltage $vb_1$ controlling varactor $B_1$ starts at VDD, control voltage $vb_2$ controlling varactor $B_2$ starts at VSS, etc. The frequency ramp starts with the DAC A 602 control voltage being supplied to varactor $A_0$. The DAC B 604 control voltage also starts as being supplied to varactor $B_0$, although the DAC B 604 control voltage is offset from the DAC A 602 control voltage as discussed above.

The DAC A 602 and DAC B 604 control voltages, and thus the corresponding control voltages $va_0$ and $vb_0$ ramp up to VDD. Once the DAC A 602 voltage reaches VDD, control $va_0$ is switched to VDD and the DAC A 602 voltage is supplied to varactor $A_1$. Due to the above-described offset, the DAC B 604 voltage is still controlling $vb_0$ when the DAC A 602 voltage switches so as to control varactor $A_1$ via control $va_1$. The DAC A 602 voltage, now controlling $va_1$ for varactor $A_1$, begins to ramp down to VSS while the DAC B 604 voltage continues to ramp up to VDD until $vb_0$ reaches VDD. Once the DAC B 604 voltage reaches VDD, the DAC B 604 voltage switches so as to control varactor $B_1$ via control $vb_1$. At this point, the DAC A 602 voltage still controls varactor $A_1$ via control $va_1$. The DAC A 602 voltage and DAC B 604 voltage are then both ramping down towards VSS.

Once the DAC A 602 voltage reaches VSS, the control $va_1$ is tied to VSS and the DAC A voltage switches so as to control varactor $A_2$ via control $va_2$. While DAC A 602 transitions from control varactor $A_1$ to controlling varactor $A_2$, the DAC B 604 voltage is still controlling varactor $B_1$ as it ramps down towards VSS due to the offset of the DAC A 602 and DAC B 604 voltages. The DAC B 604 voltage continues to ramp down towards VSS controlling varactor $B_1$ via control $vb_1$ while the DAC A 602 voltage begins to ramp up towards VDD controlling varactor $A_2$ via control $va_2$. Once the DAC B 604 voltage reaches VSS, the DAC B 604 voltage switches so as to control varactor $B_2$ via control $vb_2$ and the varactor $B_1$ is tied to VSS. At this point, both the DAC A 602 voltage and the DAC B 604 voltage are ramping up towards VDD as shown in the waveforms of FIG. 7. This process continues as the frequency increases and the DAC A 602 and DAC B 604 voltages continue to sequentially control varactors in the varactor bank A 601 and the varactor bank B 603.

Returning to FIG. 6, the dual folding varactor structure 600 may further include a differentially controlled analog varactor set 606. The differentially controlled analog varactor set 606 can be used to change the VCO frequency in proportion to the control voltage denoted $V_{prop}$ in FIG. 6. The differentially controlled analog varactor set 606 provides an additional way of changing the frequency scheme, which may be used in addition to the folding varactor control described above. The differentially controlled analog varactor set 606 may be controlled by the analog control 203 in hybrid PLL 200 as part of the analog proportional path control. In some embodiments, the dual folding varactor structure 600 does not include the differentially controlled analog varactor set 606.

The dual folding varactor structure 600 also includes a set of coarse control fixed capacitors 607. The VCO of the dual folding varactor structure 600 may include the set of coarse control fixed capacitors 607 for coarse band tuning of a magnitude of the variable capacitance of the VCO. Each of the coarse control fixed capacitors 607 may be a digitally switched high-Q capacitor unit. Each capacitor unit includes a pair of capacitors as shown in FIG. 6. One of the coarse tuning bands may be selected by controlling which of the coarse control fixed capacitors 607 is enabled, with the varactor bank A 601 and the varactor bank B 603 providing continuous tuning of the magnitude of the variable capacitance of the VCO within the coarse band selected by the enabled one of the coarse control fixed capacitors 607. In other embodiments, however, coarse band tuning may be eliminated.

Element 608 in the folding varactor structure 600 is a set of resistors and switches, which are used to reduce and limit the current in the VCO.

Figure 8:
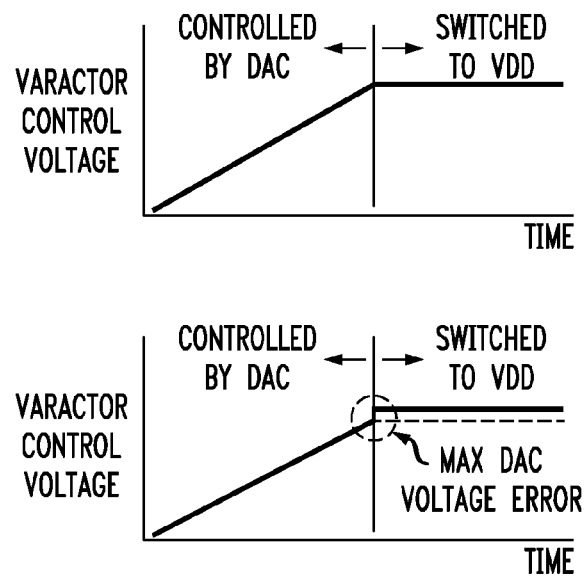
FIG. 8 shows switching the control of a varactor, according to an embodiment of the invention.

When the DAC voltage switches from one varactor to the next, there is a possibility of a small glitch if the maximum or minimum voltage that the DAC produces is not identical to the voltage applied to the varactor when switched to VDD or VSS, respectively. When a DCO is used in a PLL, if the PLL is trying to achieve lock at a frequency corresponding to a boundary between two varactors, this mismatch could result in the PLL switching back and forth between varactors. This switching can cause small periodic glitches in the output frequency of the DCO, which degrades phase noise performance. FIG. 8 illustrates switching for a positive voltage-to-frequency gain varactor from being controlled by the DAC voltage and being tied to VDD. The top plot in FIG. 8 shows the ideal case where the maximum voltage produced by the DAC is identical to VDD. The bottom plot in FIG. 8 shows the voltage error that results when the maximum voltage produced by the DAC is not identical to VDD.

Figure 9:
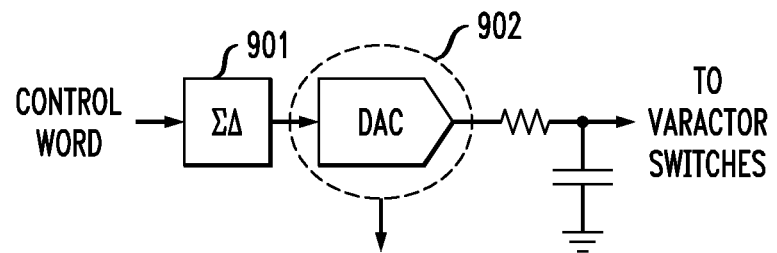
FIG. 9 shows a digital to analog converter (DAC) transfer function implementing hysteresis, according to an embodiment of the invention.
Figure 9:
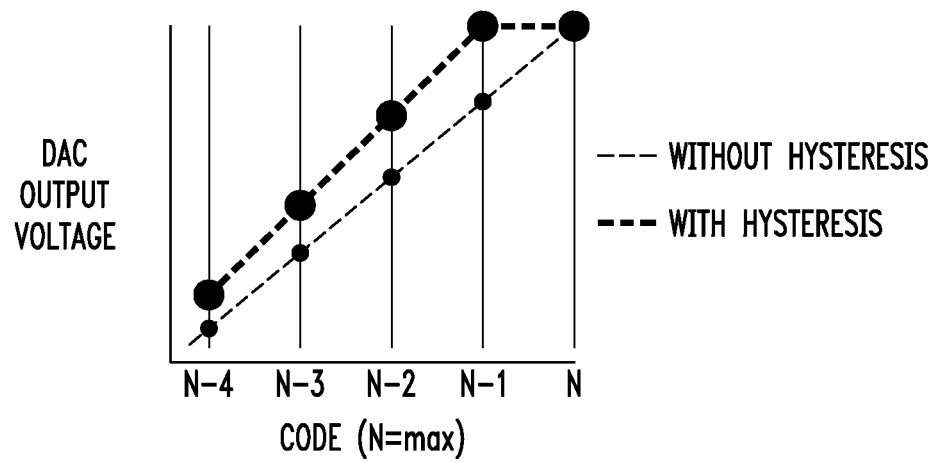

To account for the possible voltage error shown in the bottom plot of FIG. 8, some embodiments introduce hysteresis when switching between analog varactors. FIG. 9 shows a control word applied to a ΣΔ modulator 901.

The ΣΔ modulator 901 is not required, but can be used to increase the effective resolution of DAC 902. For example, consider an 8-bit DAC which has 256 levels. If the DAC has a reference voltage of 1 volt, then the DAC's step size would be 1V/255 or approximately 3.92 mV. If a step size smaller than the DAC step size is required, delta-sigma modulator 901 can be used to quickly switch the DAC between two adjacent levels so that the average output voltage is somewhere in between the two voltage levels that are being switched between. This effectively increases the resolution provided there is a downstream low pass filter that removes the noise associated with this switching between adjacent DAC levels. The RC filter shown in FIG. 9 after the DAC 902, for example, filters out this noise. The RC filters shown in FIGS. 3 and 6 provide similar functionality.

The ΣΔ modulator 901 may switch the DAC 902 between adjacent levels using a variety of patterns. For example, consider a situation in which the step size is between levels 6 and 7 of the DAC 902. The delta-sigma modulator 901 may switch the DAC 902 using a repeating sequence 6, 7, 7, 6, 7, 7, etc. to produce an average output for the DAC 902 at a 6.666 level. The delta-sigma modulator 901 may alternatively switch the DAC 902 using a repeating sequence of 6, 7, 6, 7, etc. to produce an average output for the DAC 902 at a 6.5 level or the delta-sigma modulator 901 may switch the DAC 902 using a repeating sequence of 6, 6, 7, 6, 6, 7, etc. to produce an average output for the DAC 902 at a 6.333 level. As will be appreciated, various other sequences may be used to obtain different average outputs for the DAC 902.

The plot of FIG. 9 shows the DAC output voltage for control codes N-4, N-3, N-2, N-1, and N. Without hysteresis, the DAC output voltage is different for each control code. With hysteresis, the DAC transfer function is adjusted such that the top two control codes, N-1 and N, produce the same maximum DAC output voltage. Although not shown, the DAC transfer function may be altered such that the bottom two control codes produce the same minimum DAC output voltage. This adds hysteresis, such that no limit cycles occur due to the glitches described above with respect to FIG. 8. In some embodiments, hysteresis may be introduced to the DAC transfer function by having more than the top two and bottom two control codes produce the same maximum and minimum DAC output voltage, respectively. As described above, the DAC transfer function from control word to analog voltage is not necessarily limited by the quantization step size of the DAC 902. The ΣΔ modulator 901 may be used to switch back and forth between the two closest DAC levels so that the correct average voltage is generated.

With hysteresis, when the DAC 902 reaches the top or bottom of its range and is switched from one varactor to the next, an offset is added to the DAC control such that the DAC starts in the next band at the second from top or second from bottom code instead of the top or bottom. The code second from the top still produces the maximum DAC voltage, and the code second from the bottom similarly still produces the minimum DAC voltage. The extra code switch does not increase the frequency, but increases the amount that the control would have to reduce by before switching back to the original band. If there is a positive frequency error induced by imperfect switching, then the DAC 902 will be driven back towards the first code and not immediately switch back to the original varactor.

In the context of the dual varactor folding structure 600, when a first one of the varactor bank A 601 and the varactor bank B 603 is switching between varactors, the second bank is by design in the middle of its range at or near its highest gain region. When the control code moves back to correct for the switching frequency error, the second bank also changes. As the second bank varactor voltage is in the middle of its range, it will have significantly more gain than the first bank and hence the frequency error can be corrected for with a relatively small input control word change. Provided that correcting the frequency error caused by the band switch requires a change of control code corresponding to less than 1 least significant bit of the DACs 602 and 604, the frequency error will not cause the first bank to switch back to the original varactor.

Figure 10:
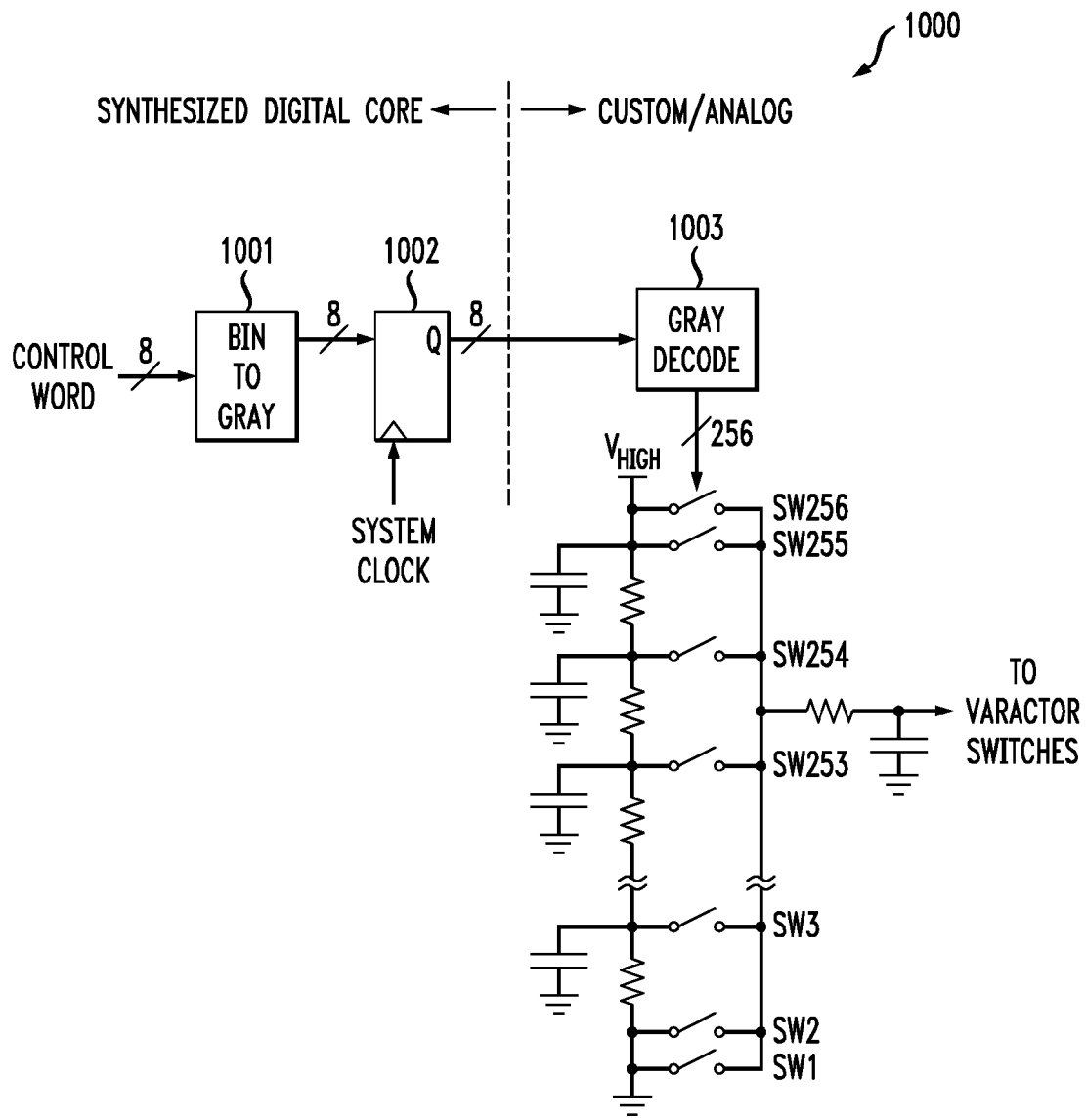
FIG. 10 shows a DAC implementation, according to an embodiment of the invention.

FIG. 10 shows a DAC implementation 1000 which may be used in the varactor structure 300 and the folding varactor structure 600. FIG. 10 specifically shows an 8-bit DAC implementation. A control word is input to a binary to Gray code converter 1001. A Gray code is used for encoding such that adjacent control words have a single binary digit that differs by 1. Flip-flop 1002 references the output of binary to Gray code converter 1002 to the system clock. Gray code decode module 1003 controls the switches SW1 through SW256 to provide the control voltages corresponding to the 256 levels of the 8-bit DAC.

Figure 11:
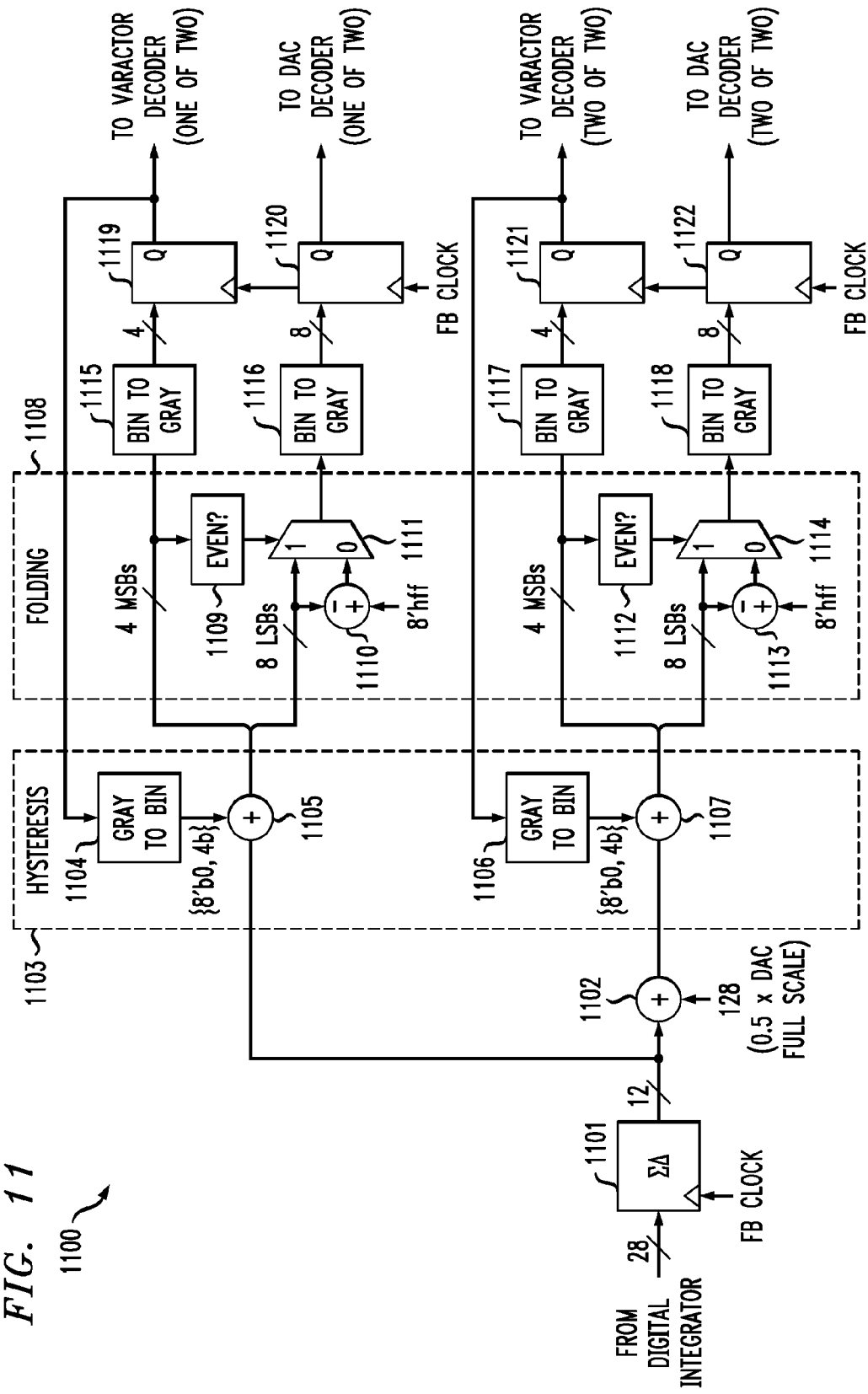
FIG. 11 shows a folding scheme control logic implementation for the dual folding varactor structure of FIG. 6, according to an embodiment of the invention.

FIG. 11 shows a folding scheme control logic 1100, which may be used in conjunction with the dual folding varactor structure 600. FIG. 11 shows a ΣΔ modulator 1101. In some embodiments, the functionality of the ΣΔ modulator 901 may instead be performed by ΣΔ modulator 1101. In these embodiments, the outputs of flip flops 1120 and 1122 go directly to DAC 602 and DAC 604 in the dual folding varactor structure 600, rather than to a ΣΔ modulator such as ΣΔ modulator 901.

The input for the folding scheme control logic 1100 is a 12-bit bus. The 12 bit input is provided to summer 1105 directly, and to summer 1107 via summer 1102. Summer 1102 provides the offset between varactor banks. The output of summers 1105 and 1107 are each split into 4 most significant bits (MSBs) and 8 least significant bits (LSBs). The 4 MSBs are used to select which varactor in each of varactor bank A 601 and varactor bank B 603 is controlled by the DAC 602 voltage and the DAC 604 voltage, respectively. The 4 MSBs are provided to binary to gray code converters 1115 and 1117, and then to flip-flops 1119 and 1122 before being provided to the varactor decoders for varactor bank A 601 and varactor bank B 603. The flip-flops 1119 and 1122 are referenced to a feedback (FB) clock.

As described above, the varactors in each of varactor bank A 601 and varactor bank B 603 have alternating polarity gains such that the first varactor has positive voltage-to-frequency gain, the second varactor has negative voltage-to-frequency gain, the third varactor has positive voltage-to-frequency gain, etc. In varactor bank A 601 and varactor bank B 603, the positive gain varactors are "even" numbered (0, 2, 4, 6 etc.) while the negative gain varactors are "odd" numbered (1, 3, 5, 7, etc.).

When the DAC voltage is being used to control an even numbered varactor, the output of multiplexer 1111 and multiplexer 1114 is set to the 8 LSBs of the input. When the DAC voltage is being used to control an odd numbered varactor, the output of multiplexer 1111 and multiplexer 1114 is modified so that when the input code is minimum, the output code is maximum and vice versa. Thus, the output of the multiplexers 1111 and 1114 when controlling an odd numbered varactor is the full scale minus the 8 LSBs. Expressed in binary, the output of multiplexers 1111 and 1114 when controlling an odd numbered varactor is (11111111)—8 LSBs. The notation 8'hff in FIG. 11 is Verilog for 8 bits of hexadecimal "ff", or in binary 11111111.

In the folding scheme control logic 1100, even detector 1109 and the even detector 1112 determine whether the 4 MSBs are controlling an odd or even numbered varactor. It is important to note that due to the offset provided by summer 1102, the 4 MSBs input to even detector 1109 and the 4 MSBs input to even detector 1112 need not be the same. Thus, one of the even detectors 1109 and 1112 can determine that an even numbered varactor in one bank is to be controlled by the DAC voltage while the other one of the even detectors 1109 and 1112 determines that an odd numbered varactor is to be controlled by the DAC voltage in the other bank.

For varactor bank A 601, the 8 LSBs, and the difference between full scale and the 8 LSBs as determined by summer 1110 are input to multiplexer 1111. Even detector 1109 provides the control signal for multiplexer 1111 to control which input to the multiplexer 1111 is output to binary to gray code converter 1116. The output of binary to gray code converter 1116 is input to flip-flip 1120 and to DAC 602. The flip-flip 1120 is referenced by the FB clock. Similar logic is provided by even detector 1112, summer 1113 and multiplexer 1114 for varactor bank B 603. The elements 1109, 1110, 1111, 1112, 1113 and 1114 form a folding control module 1108 as shown in FIG. 11.

The outputs of flip-flops 1119 and 1121 are fed back to gray code to binary converters 1104 and 1106, respectively. The output of gray code to binary converter 1104 is input to summer 1105 along with the 12 bit input. The summer 1105 provides hysteresis for the DAC A 602 transfer function in the manner described above with respect to FIGS. 8 and 9. Similarly, the summer 1107 provides hysteresis for the DAC B 604 transfer function. Thus, the elements 1103, 1104, 1105, 1106 and 1107 form a hysteresis module 1103 as shown in FIG. 11. The folding scheme control logic 1100 may be simplified for use with the folding varactor structure 300. For example, folding varactor structure 300 may be controlled using only elements 1101, 1105, 1106, 1109, 1110, 1111, 1115, 1116, 1119 and 1120 in folding scheme control logic 1100.

The varactor folding structure 300 and the dual folding varactor structure 600 described above provide a number of advantages relative to conventional techniques. For example, these structures are compatible with linearization, are inherently highly glitch-resistant due to the manner in which analog and digital control handoff is managed, and allow for a wide continuous tuning range coverage without the need for a high gain varactor or high resolution DAC.

In some embodiments, the folding concept described in conjunction with varactor folding structure 300 and dual varactor folding structure 600 may be extended to folding control of high-Q switched capacitors within a main PLL loop. Folding control of high-Q switched capacitors enables the elimination of coarse band controls and associated non-ideal infrastructure for wide tuning range, high performance VCOs.

The design of high performance VCOs typically involves a tradeoff between the VCO's phase noise performance and the VCO's continuous, glitch free tuning range. High performance VCO designs may be implemented with a coarse banding approach, which splits the VCO tuning range between a continuous but low Q part and a discrete high Q part. Continuously tunable varactors, also referred to as analog varactors, generally have lower quality factors than digitally switched capacitors.

VCOs capable of achieving good phase noise performance and a wide tuning range can be implemented with two sets of varactors, a continuously tuned analog varactor and one or more digitally switched capacitors in the form of high-Q capacitors in series with digital switches. However, as temperature and voltage change, the frequency range associated with each discrete band may move, requiring careful initial band choice and large band overlap or loss of lock may occur. Choosing the size of the analog varactors in such an arrangement involves a tradeoff between phase noise of the VCO and the frequency range over which the PLL can maintain a continuous lock. If the analog varactor size is small relative to the total capacitance of the VCO, the frequency range over which the PLL can remain locked is small. Small analog varactor size, however, can improve the VCO's phase noise performance because the bulk of the VCO's capacitance can be comprised of fixed, or digitally switched high-Q capacitors.

Figure 12:
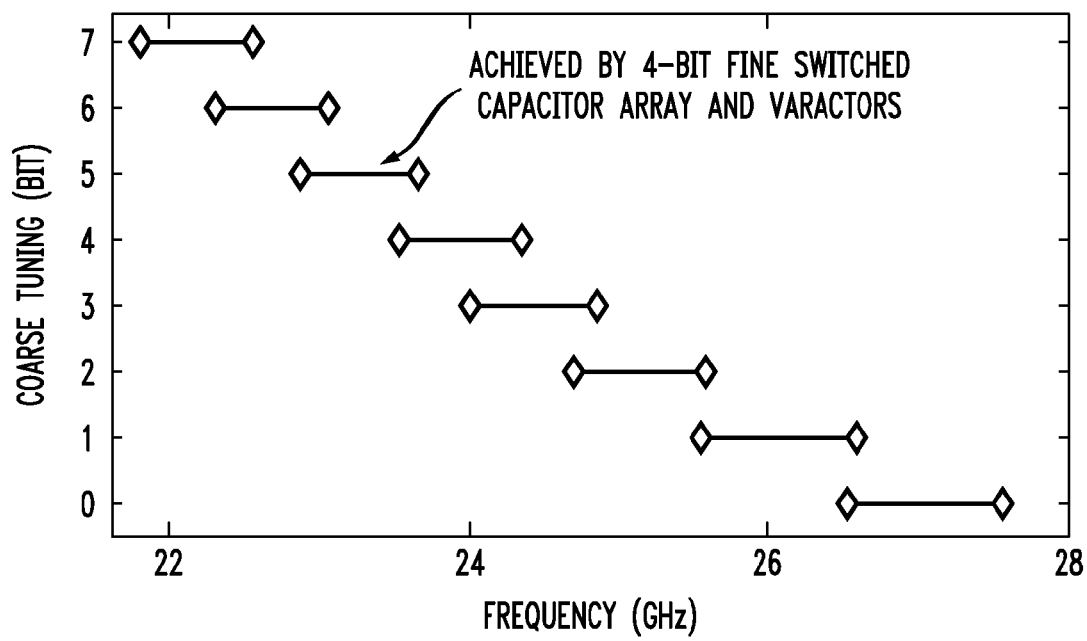
FIG. 12 shows coarse tuning of a capacitor array, according to an embodiment of the invention.

FIG. 12 illustrates an example of the tradeoff that occurs for a coarse tuning capacitor array. FIG. 12 illustrate a 4-bit fine switched capacitor array having 8 coarse tuning bands. Continuous tuning is restricted to within each coarse band, and the bands have significant overlap with one another. In some embodiments, a folding scheme is used such that a VCO's entire tuning range is accessed within the PLL's primary control loop without a phase noise penalty thus implementing a high-Q wide tuning and low noise PLL eliminating coarse band control.

Figure 13:
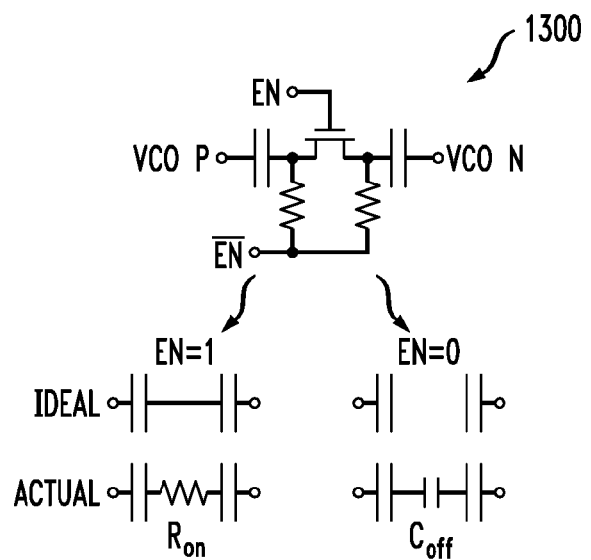
FIG. 13 shows a high-Q switched capacitor, according to an embodiment of the invention.

FIG. 13 shows an example of a high-Q switched capacitor unit 1300. As shown in FIG. 13, the high-Q switched capacitor unit 1300 includes a pair of capacitors in high-Q switched capacitor unit 1300. At high frequency, such as frequencies over 10 GHz, phase noise performance is limited by the Q of the capacitors. Fixed metal-to-metal capacitors with a series switch give better phase noise as compared with an analog varactor. When the enable signal EN is set to 1, the capacitors are connected to one another. Ideally, when EN=1 the switch, shown in FIG. 13 as an NMOS transistor, should have zero on resistance $R_{on}$ and when EN=0 the switch should have zero off parasitic capacitance $C_{off}$. In practice, the switch has some non-zero on resistance $R_{on}$ and some non-zero parasitic capacitance $C_{off}$. The resistance of the switch may be reduced by increasing the size of the switch, but this comes at the cost of greater off-state parasitic capacitance. One metric used for switches in high frequency applications is the $R_{on}$ to $C_{off}$ product. FIG. 13 illustrates the difference between the ideal and actual scenarios.

Figure 14:
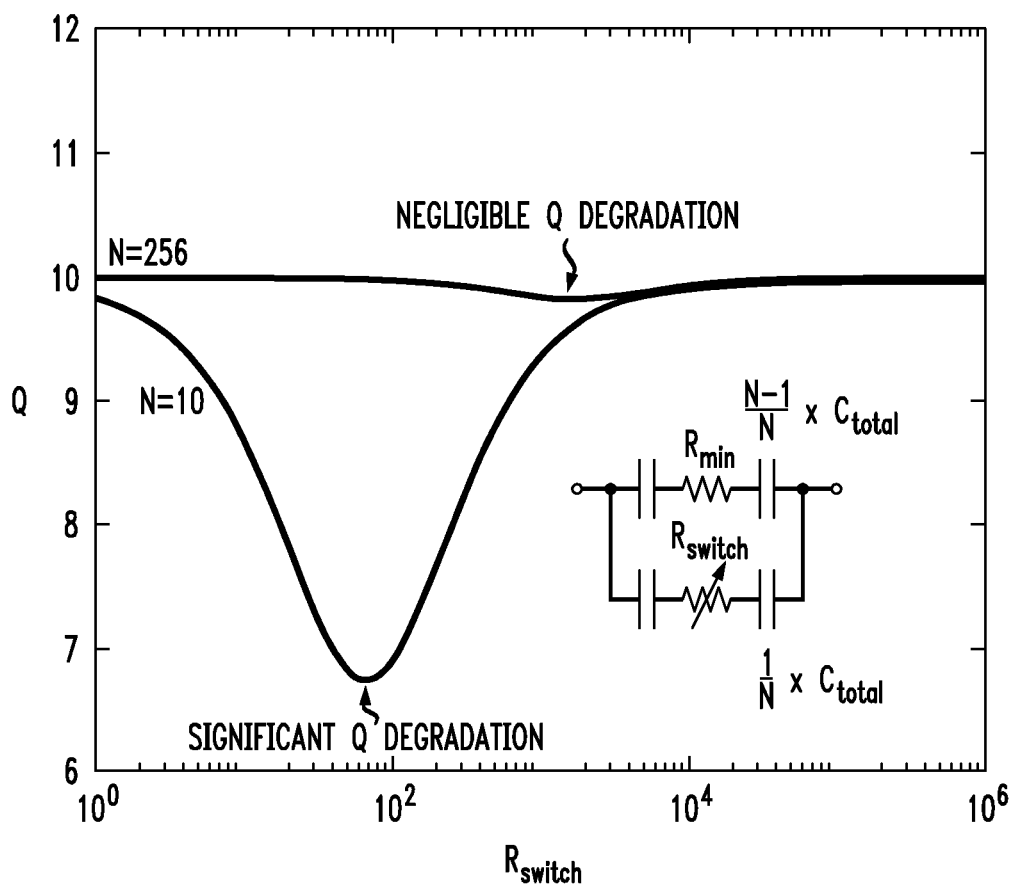
FIG. 14 shows the effect of a series resistance of a single capacitor on the Q of a bank of capacitors, according to an embodiment of the invention.

A digitally controlled switch, such as the NMOS transistor of high-Q switched capacitor unit 1300, can be gradually transitioned between its on and off state to provide continuous tuning. However, when the control signal for the digitally controlled switch is between its extremes the series loss of the switch will degrade the Q of the switched capacitor unit 1300, resulting in a degradation of phase noise. Folding schemes allow for seamless switching between bands, so the capacitance can be broken down into a large number of small capacitor units. As long as the size of the capacitor unit that is transitioning between its on and off states is a small fraction of the total capacitance, then the entire structure will have high Q even if one of the capacitors is in a low Q state. FIG. 14 illustrates this principle, showing the effect of series resistance of a single capacitor unit on the Q of a bank of N capacitor units. FIG. 14 shows a plot of the Q factor for a bank of N capacitor units over the on-resistance of the switches for capacitor units in the bank, $R_{switch}$. As shown in FIG. 14, there is significant Q degradation for a small bank of N=10 capacitor units but there is negligible Q degradation for a large bank of N=256 capacitor units, as the Q is limited by the on resistance of the capacitor switches $R_{min}$.

It is important to note that embodiments are not limited solely to use with a bank of 256 digitally switched capacitor units connected in series. While FIG. 14 shows that such an arrangement generally provides for negligible Q degradation, different numbers of digitally switched capacitors may be used in other embodiments based on an acceptable Q degradation for a particular application.

Figure 15:
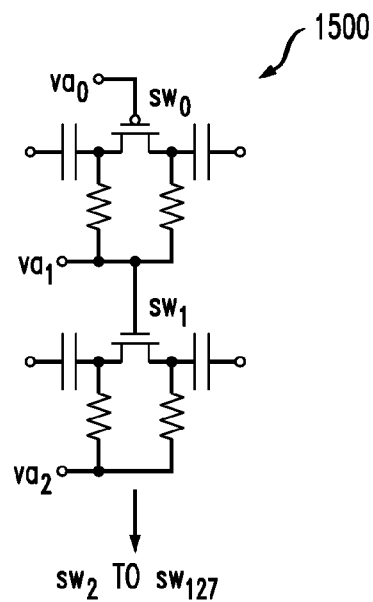
FIG. 15 shows a folding switched capacitor structure, according to an embodiment of the invention.

FIG. 15 shows a folding switched capacitor structure 1500. FIG. 15 shows capacitor units each comprising a pair of capacitors controlled by switches $sw_0, sw_1, \ldots, sw_{127}$. Each switch $sw_0, sw_1, \ldots, sw_{127}$ is controlled by a corresponding control signal $va_0, va_1, va_{127}$. The overall capacitance of the folding switched capacitor structure 1500 is split into small capacitor units, controlled by alternating NMOS and PMOS switches. As shown in FIG. 15, the "even" digitally switched capacitor units 0, 2, 4, etc. are controlled by PMOS switches and are associated with positive voltage-to-frequency gain while the "odd" digitally switched capacitor units 1, 3, 5, etc. are controlled by NMOS switches and are associated with negative voltage-to-frequency gain.

Although FIG. 15 shows the even and odd digitally switched capacitor units physically placed next to one another, this is not a requirement. The even and odd digitally switched capacitor units need not be physically placed next to one another, as long as the sequence in which positive voltage-to-frequency gain ones of the digitally switched capacitor units and negative voltage-to-frequency gain ones of the digitally switched capacitor units are alternately controlled as described herein.

A single thermometer coded capacitor bank is used to cover the entire tuning range, eliminating coarse bands. A folding structure is used to gradually transition one of the switches $sw_0$ through $sw_{127}$ between its on and off state while remaining switches and corresponding capacitor units are saturated in their on (high Q) or off (high impedance) state.

Figure 16:
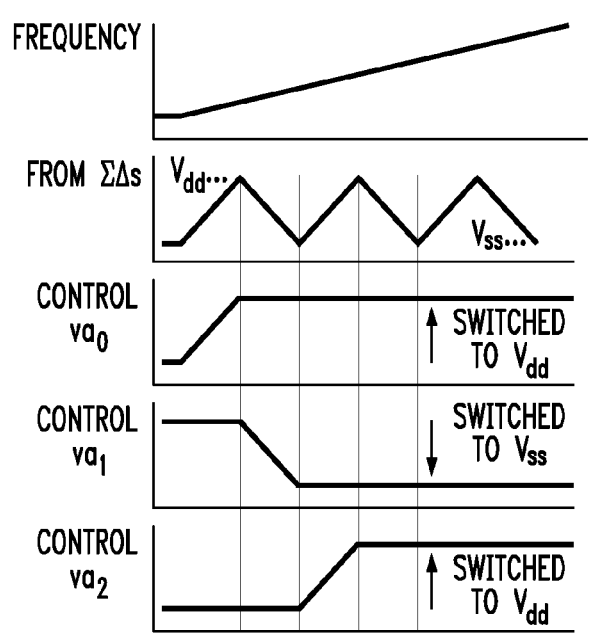
FIG. 16 shows example waveforms for generating a frequency ramp in the folding switched capacitor structure of FIG. 15, according to an embodiment of the invention.

FIG. 16 shows waveforms for generating a frequency ramp in folding switched capacitor structure 1500. The DAC control voltage from $\Sigma\Delta$ ramps up and down between VDD and VSS. Initially, the control voltages applied to the even PMOS switches are saturated at VSS while the control voltages applied to the odd NMOS switches are saturated at VDD. To begin, the control $va_0$ for switched capacitor unit 0 is supplied with the DAC control voltage. To increase the frequency, the control $va_0$ gradually ramps up to VDD until the capacitor unit 0 is saturated in its high impedance state. If the frequency needs to increase further, the control $va_0$ for capacitor unit 0 is tied to VDD and the control $va_1$ for capacitor unit 1 is supplied with the DAC control voltage. The DAC control voltage ramps down from VDD to VSS to increase the frequency. On reaching VSS, the control $va_1$ is tied to VSS and the control $va_2$ for capacitor unit 2 is supplied with the DAC control voltage, which begins to ramp back up towards VDD. This process continues through capacitor units 2 through 127, or until the desired frequency is reached.

Figure 17:
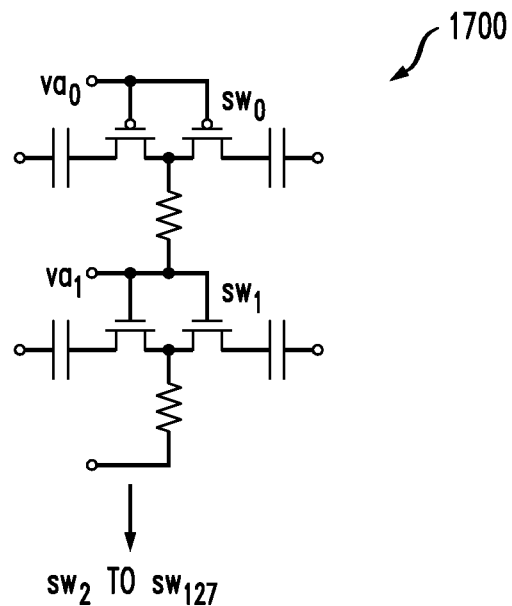
FIG. 17 shows a folding switched capacitor structure with dual switch capacitor units, according to an embodiment of the invention.
Figure 18:
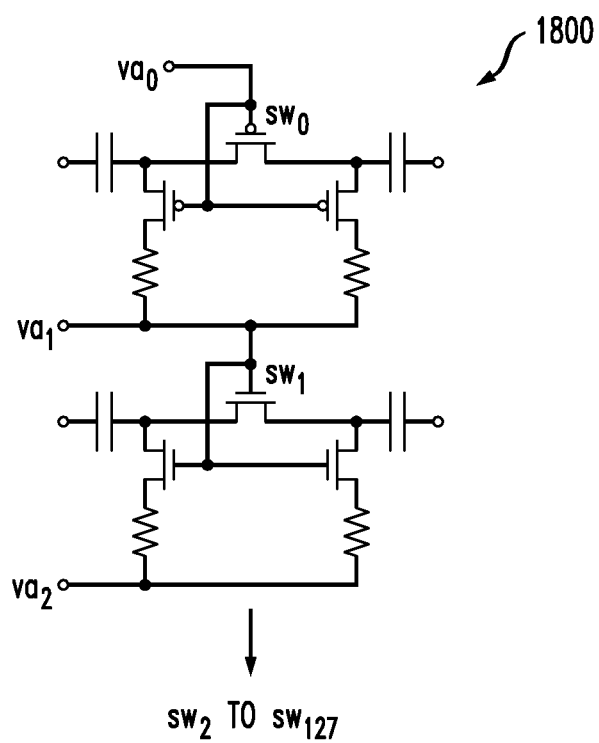
FIG. 18 shows a folding switched capacitor structure with triple switch capacitor units, according to an embodiment of the invention.

In the switched capacitor units shown in folding switched capacitor structure 1500, the resistances shown between the capacitor units have a degrading effect on the Q (de-Qing effect) of the capacitor units. To account for this degrading effect, some embodiments use alternative structures for the switched capacitor units. FIGS. 17 and 18 show two such alternative structures.

FIG. 17 shows folding switched capacitor structure 1700 where each capacitor unit has dual switches. Capacitor unit 0 includes two PMOS switches $sw_0$ each controlled by control $va_0$, capacitor unit 1 includes two NMOS switches $sw_1$ each controlled by control $va_1$, etc. The dual switch arrangement shields the capacitor banks in each capacitor unit from the de-Qing effect of the resistance R between the capacitor units. When the switch of the capacitor unit is off, ideally the impedance seen at the switch side of the capacitors would be as large as possible. If a resistor is used to set the DC bias of the nodes connected to the capacitors, then the switch will reduce the effective off-state impedance of the switch/capacitor combination. Nevertheless, it is important to provide a DC bias to the drain and source of the switch, particularly when the switched capacitor unit is on. By using two transistor switches in series as shown in FIG. 17, the transistors can be provided with a DC bias voltage without the bias resistor reducing the impedance seen at the capacitor node. When the two transistors of the switch are off, the impedance of the DC biasing resistor does not reduce the impedance seen at the capacitor terminal because of the high off impedance of the switch. The dual switch arrangement shown in FIG. 17, however, has additional parasitic capacitance for a given on resistance, as the dual or parallel switch in folding switched capacitor structure 1700 is twice the size of the single switch used in folding switched capacitor structure 1500.

FIG. 18 shows folding switched capacitor structure 1800 where each capacitor unit has three switches. Capacitor unit 0 includes three PMOS switches $sw_0$ each controlled by control $va_0$, capacitor unit 1 includes three NMOS switches $sw_1$ each controlled by control $va_1$, etc. The FET switches create a high resistance in the off state to shield the capacitor tanks in each unit from the de-Qing effect of the resistance R between capacitor units. The same effect could be achieved without the FET switches by making the resistors bigger. However, in a CMOS manufacturing process the physical area required to implement a high impedance resistor is often much larger than the physical area of a FET switch. As the folding switched capacitor structure 1800 has a large number of switched capacitor units, it may be important for the switched capacitor units to be implemented in such a way that it is efficient in terms of area usage.

FIG. 18 shows each capacitor unit having three FET switches. For example, the switched capacitor units each have a "primary" switch (the top switch) and two "biasing" switches below the primary switch. When the primary switch is on, the biasing switches are also on and the impedance of the DC biasing network is primarily set by the resistors. The de-Qing effect of the biasing impedance is more important when the primary switch is off as the off-state impedance should be high. Thus, when the primary switch is off the biasing switches are also off. The off-state leakage current from drain to source of the biasing switches is still sufficient to bias the voltage at the capacitor nodes. Thus, the series switches act to increase the impedance of the DC biasing scheme when the switch is off. The triple switch arrangement shown in FIG. 18, however, has some dependence on device leakage for proper operation.

Figure 19:
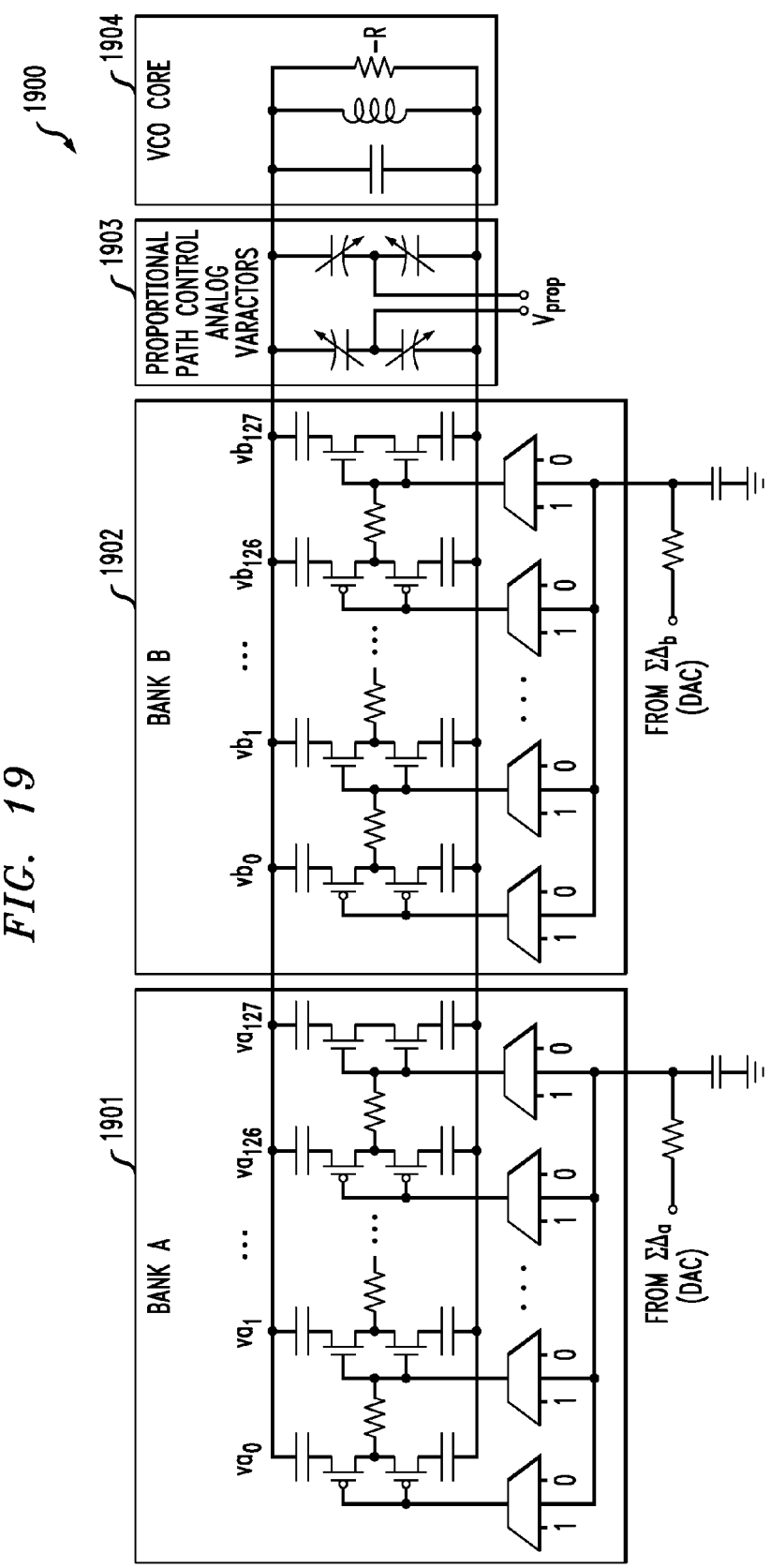
FIG. 19 shows a dual bank folding switched capacitor structure, according to an embodiment of the invention.

FIG. 19 shows a dual bank folding switched capacitor structure 1900 implemented in a VCO. The dual bank folding switched capacitor structure 1900 includes bank A 1901, bank B 1902, differentially controlled analog varactors 1903 and VCO core 1904. The differentially controlled analog varactors 1903 operate in a manner similar to the differentially controlled analog varactor set 606 described above with respect to dual folding varactor structure 600.

Each of bank A 1901 and bank B 1902 includes a series of digitally switched capacitor units. FIG. 19 shows each of bank A 1901 and bank B 1902 utilizing the dual switch capacitor unit structure described above with respect to FIG. 17. Embodiments, however, are not limited solely to use with the dual switch capacitor units. Instead, the bank A 1901 and bank B 1902 may each use the single switch or triple switch arrangements described above with respect to FIGS. 15 and 18, respectively.

The capacitor units in bank A 1901 and bank B 1902 have multiplexers providing the control signals to each capacitor unit in the respective banks. A controller such as digital control 104 in digital PLL 100 or digital control 204 in hybrid PLL 200 may be used to control the multiplexers for each bank. For bank A 1901 the DAC control voltage from $\Sigma \Delta_a$ is provided to one of the capacitor units, while other capacitor units in bank A 1901 are tied to VDD or VSS. Similarly, for bank B 1902 the DAC control voltage from $\Sigma \Delta_b$ is provided to one of the capacitor units, while other capacitor units in bank B 1902 are tied to VDD or VSS. Thus, at any given time one of the capacitor units in bank A 1901 is connected to the DAC control voltage from $\Sigma \Delta_a$, one of the capacitor units in bank B 1902 is connected to the DAC control voltage from $\Sigma \Delta_b$, and the remainder of the capacitor units in bank A 1901 and bank B 1902 are saturated at their high Q or high impedance state by being tied to one of VDD and VSS.

The control for each of the banks in dual bank folding switched capacitor structure 1900 is similar to the control scheme described above with respect to FIG. 16. Each bank's control may be offset from one another in the manner described above with respect to the dual varactor bank structure described in conjunction with FIGS. 6 and 7.

Hysteresis may be added into the DAC transfer functions for the switched capacitor structures shown in FIGS. 15, 17, 18 and 19 in a manner similar to that described above with respect to FIGS. 8 and 9.

Similar to FIG. 15, there is no requirement that the even and odd digitally switch capacitor units in FIGS. 17-19 be physically placed next to one another as long as the sequence in which positive voltage-to-frequency gain ones of the digitally switched capacitor units and negative voltage-to-frequency gain ones of the digitally switched capacitor units are alternately controlled as described herein.

Figure 20:
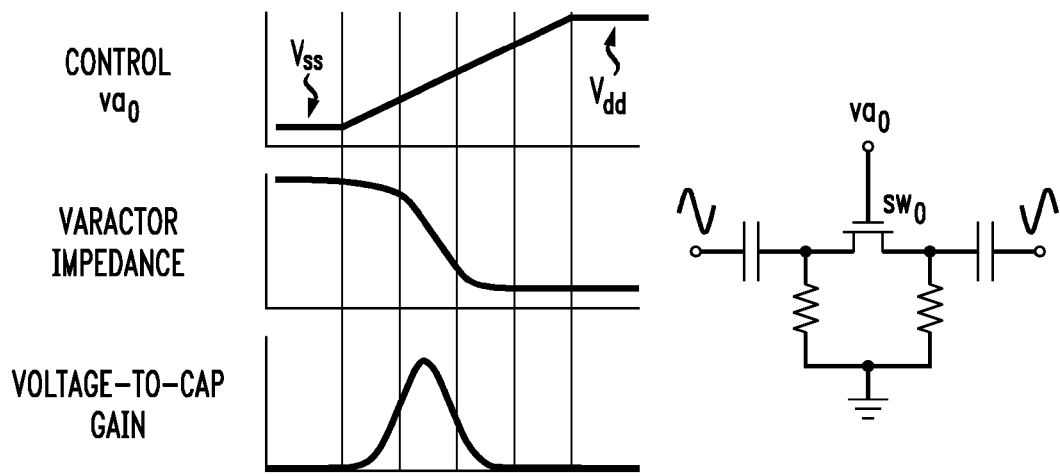
FIG. 20 shows the voltage-to-capacitance transfer function for a high-Q switched capacitor controlled by a single switch, according to an embodiment of the invention.

FIG. 20 illustrates the voltage-to-capacitance transfer function for a high-Q switched capacitor. FIG. 20 shows an NMOS switched capacitor unit. The NMOS switch $sw_0$ has its gate coupled to control $va_0$. A MOS switch, such as NMOS switch $sw_0$, can turn on too quickly. The voltage-to-capacitance transfer function shown in the plots of FIG. 20 show that the NMOS switch under appropriate large signal excitation turns from on to off in approximately ¼ of the control voltage change, which may be 250 mV for a 1V process. A PMOS switch has this same issue. Thus, the voltage-to-capacitance gain is highly concentrated in the ¼ control voltage change and the voltage-to-capacitance transfer function is nonlinear. Even in the dual bank folding switched capacitor structure 1900, the voltage-to-capacitance structure may be nonlinear. One solution is to use four varactor banks, each of which are offset form one another by ¼ of the range of a capacitor unit. This solution, however, requires significantly more hardware.

Figure 21:
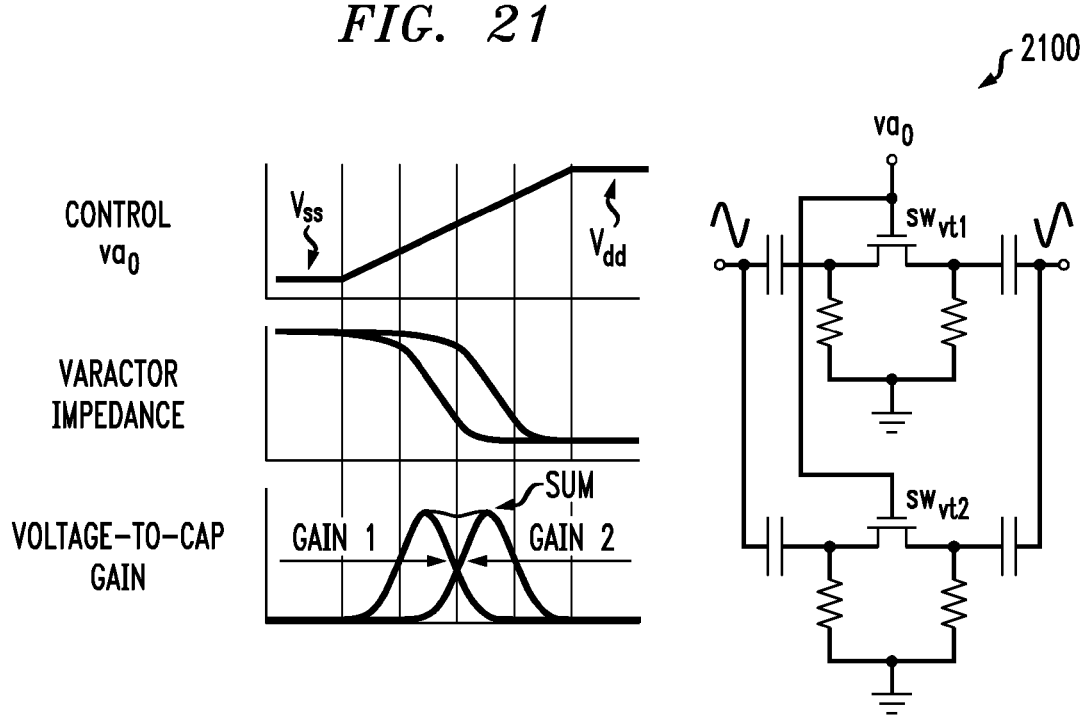
FIG. 21 shows the voltage-to-capacitance transfer function for a high-Q switched capacitor controlled with multiple switches having different threshold voltages, according to an embodiment of the invention.

FIG. 21 illustrates the voltage-to-capacitor transfer function for a high-Q switched capacitor unit 2100 having two pairs of capacitors. The first pair of capacitors has an NMOS switch $sw_{vt1}$ and the second pair of capacitors has an NMOS switch $sw_{vt2}$. Control $va_0$ is supplied to the gates of switches $sw_{vt1}$ and $sw_{vt2}$. The NMOS switch $sw_{vt1}$ and NMOS switch $sw_{vt2}$ have different threshold voltages. The voltage difference between the transistor turn on time is equal to the difference in threshold voltages between NMOS switch $sw_{vt1}$ and NMOS switch $sw_{vt2}$. The difference in thresholds may be selected to be VDD/4 (250 mV for a 1V process) resulting in a voltage-to-capacitance gain of the aggregate structure that is more linear over the 250 mV range. Although shown in FIG. 21 with NMOS switches, a high-Q switched capacitor unit may also be formed with two PMOS switches having different threshold voltages.

FIG. 22 shows a method 2200 for controlling a digitally controlled circuit. The method 2200 beings with generating 2202 a control voltage for a digitally controlled circuit having a variable capacitance. FIG. 23 shows an example of a folding controller 2302 and digitally controlled circuit 2304. The folding controller 2302 may perform the method 2200. The digitally controlled circuit 2304 may be an oscillator, a PLL, a filter, etc. The control voltage may be generated using a DAC in the manner described above. The digitally controlled circuit has a plurality of gain elements, including one or more positive voltage-to-frequency gain elements and one or more negative voltage-to-frequency gain elements. FIGS. 3, 6, 15, 17, 18 and 19 described above show examples of such a digitally controlled circuit.

The method 2200 continues with providing 2204 control signals to the plurality of gain elements of the digitally controlled circuit by applying the control voltage to a first one of the plurality of gain elements and applying a fixed high voltage or a fixed low voltage to other ones of the plurality of gain elements. As described above with respect to FIGS. 6 and 19, in some embodiments gain elements of a digitally controlled circuit may be arranged in multiple banks. In these embodiments, step 2204 involves providing offset control voltages to one gain element in each of the multiple banks.

In step 2206, the magnitude of the variable capacitance of the digitally controlled circuit is adjusted by adjusting the control voltage applied to the first gain element. If the first gain element is saturated and further adjustment of the magnitude of the variable capacitance is desired, the method continues with adjusting 2208 the control signals to apply the control voltage to a second one of the plurality of gain elements while the fixed high voltage or the fixed low voltage is applied to the first gain element. The first gain element and the second gain element have opposite polarities, i.e., the first gain element is one of a positive voltage-to-frequency gain element and a negative voltage-to-frequency gain element while the second gain element is the other one of a positive voltage-to-frequency gain element and a negative voltage-to-frequency gain element. Steps 2206 and 2208 may be repeated as necessary to further adjust the magnitude of the capacitance of the digitally controlled circuit by providing the control voltage to the gain elements in an alternating sequence of positive and negative voltage-to-frequency gain elements.

Various structures described above may be implemented in integrated circuits. It is to be appreciated that, in an illustrative integrated circuit implementation, one or more integrated circuit dies are typically formed in a pattern on a surface of a wafer. Each such die may include a device comprising circuitry as described herein, and may include other structures or circuits. The dies are cut or diced from the wafer, then packaged as integrated circuits. One ordinarily skilled in the art would know how to dice wafers and package dies to produce packaged integrated circuits. Integrated circuits, manufactured as above and/or in other ways, are considered part of this invention. It is to be understood that circuits in some embodiments can be formed across multiple integrated circuits.

It will be appreciated and should be understood that the exemplary embodiments of the invention described above can be implemented in a number of different fashions. Given the teachings of the invention provided herein, one of ordinary skill in the related art will be able to contemplate other implementations of the invention. Indeed, although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An apparatus comprising:
a digitally controlled circuit having a variable capacitance, wherein the digitally controlled circuit comprises a plurality of gain elements, the plurality of gain elements comprising one or more positive voltage-to-frequency gain elements and one or more negative voltage-to-frequency gain elements;
a controller configured to adjust a magnitude of the variable capacitance of the digitally controlled circuit;
a digital-to-analog converter providing a digital-to-analog control voltage responsive to control codes supplied by the controller; and
a plurality of switches configured to select one of the digital-to-analog control voltage, a fixed high voltage and a fixed low voltage to connect to corresponding ones of the plurality of gain elements responsive to corresponding control signals from the controller;
wherein the controller is configured to adjust the magnitude of the capacitance by adjusting the gain provided by respective ones of the gain elements in an alternating sequence of the positive voltage-to-frequency gain elements and the negative voltage-to-frequency gain elements;
wherein the controller is configured to adjust the control signals such that one of the plurality of gain elements is supplied with the digital-to-analog control voltage while remaining ones of the plurality of gain elements are supplied with the fixed high voltage or the fixed low voltage; and
wherein the digital-to-analog converter comprises a transfer function such that at least a top two control codes produce a same maximum voltage and at least a bottom two control codes produce a same minimum voltage.

2. An apparatus comprising:
a digitally controlled circuit having a variable capacitance; and
a controller configured to adjust a magnitude of the variable capacitance of the digitally controlled circuit;
wherein the digitally controlled circuit comprises a plurality of gain elements, the plurality of gain elements comprising one or more positive voltage-to-frequency gain elements and one or more negative voltage-to-frequency gain elements;
wherein the controller is configured to adjust the magnitude of the capacitance by adjusting the gain provided by respective ones of the gain elements in an alternating sequence of the positive voltage-to-frequency gain elements and the negative voltage-to-frequency gain elements;
wherein the plurality of gain elements comprises two or more banks of gain elements; and
wherein control signals provided by the controller for gain elements in the two or more banks are offset from one another.

3. The apparatus of claim 2, wherein the magnitude of the offset of the control signals is based at least in part on the number of banks of gain elements.

4. The apparatus of claim 2, further comprising:
first and second digital-to-analog converters providing respective first and second digital-to-analog control voltages responsive to control codes supplied by the controller;
a first plurality of switches configured to select one of the first digital-to-analog control voltage, a fixed high voltage and a fixed low voltage to connect to corresponding ones of a first one of the two or more banks of gain elements responsive to corresponding control signals from the controller;

a second plurality of switches configured to select one of the second digital-to-analog control voltage, the fixed high voltage and the fixed low voltage to connect to corresponding ones of a second one of the two or more banks of gain elements responsive to corresponding control signals from the controller;

wherein the controller is configured to adjust the control signals such that one of the gain elements in the first bank is supplied with the first digital-to-analog control voltage, one of the gain elements in the second bank is supplied with the second digital-to-analog control voltage, and remaining ones of the gain elements in the first bank and the second bank are supplied with the fixed high voltage or the fixed low voltage.

5. The apparatus of claim 1, wherein the digitally controlled circuit comprises one of an oscillator and a filter.

6. The apparatus of claim 1, wherein the plurality of gain elements comprise varactors.

7. An apparatus comprising:
a digitally controlled circuit having a variable capacitance; and
a controller configured to adjust a magnitude of the variable capacitance of the digitally controlled circuit;
wherein the digitally controlled circuit comprises a plurality of gain elements, the plurality of gain elements comprising one or more positive voltage-to-frequency gain elements and one or more negative voltage-to-frequency gain elements;
wherein the controller is configured to adjust the magnitude of the capacitance by adjusting the gain provided by respective ones of the gain elements in an alternating sequence of the positive voltage-to-frequency gain elements and the negative voltage-to-frequency gain elements; and
wherein the digitally controlled circuit comprises two or more digitally switched high-Q capacitors for coarse band tuning of the magnitude of the variable capacitance, the plurality of gain elements comprising a plurality of digitally controlled varactors providing for continuous tuning of the magnitude of the variable capacitance within a given coarse band.

8. The apparatus of claim 1, wherein the plurality of gain elements comprise high-Q switched capacitors.

9. An apparatus comprising:
a digitally controlled circuit having a variable capacitance; and
a controller configured to adjust a magnitude of the variable capacitance of the digitally controlled circuit;
wherein the digitally controlled circuit comprises a plurality of gain elements, the plurality of gain elements comprising one or more positive voltage-to-frequency gain elements and one or more negative voltage-to-frequency gain elements;
wherein the controller is configured to adjust the magnitude of the capacitance by adjusting the gain provided by respective ones of the gain elements in an alternating sequence of the positive voltage-to-frequency gain elements and the negative voltage-to-frequency gain elements;
wherein the plurality of gain elements comprise high-Q switched capacitors; and
wherein each of the high-Q switched capacitors comprises a first switched capacitor controlled by a first transistor and a second switched capacitor controlled by a second transistor, the controller being configured to provide a same control voltage to each of the first transistor and the second transistor, the first transistor and the second transistor having different threshold voltages.

10. An integrated circuit comprising the apparatus of claim 1.

11. A phase-locked loop comprising:
a phase detector;
a filter having at least one input coupled to at least one output of the phase detector;
a controller having at least one input coupled to at least one output of the filter;
an oscillator having a variable capacitance, the oscillator having at least one input coupled to at least one output of the controller; and
a divider having at least one input coupled to at least one output of the oscillator and at least one output coupled to at least one input of the phase detector;
wherein the oscillator comprises a plurality of gain elements, the plurality of gain elements comprising one or more positive voltage-to-frequency gain elements and one or more negative voltage-to-frequency gain elements;
wherein the controller is configured to adjust the magnitude of the capacitance by adjusting the gain provided by respective ones of the gain elements in an alternating sequence of the positive voltage-to-frequency gain elements and the negative voltage-to-frequency gain elements
wherein the plurality of gain elements comprises two or more banks of gain elements; and
wherein control signals provided by the controller for gain elements in the two or more banks are offset from one another.

12. The phase-locked loop of claim 11, wherein the plurality of gain elements comprise varactors.

13. The phase-locked loop of claim 11 wherein the plurality of gain elements comprise high-Q switched capacitors.

14. The phase-locked loop of claim 13, wherein each of the high-Q switched capacitors comprises a first switched capacitor controlled by a first transistor and a second switched capacitor controlled by a second transistor, the controller being configured to provide a same control voltage to each of the first transistor and the second transistor, the first transistor and the second transistor having different threshold voltages.

15. The phase-locked loop of claim 11, wherein the magnitude of the offset of the control signals is based at least in part on the number of banks of gain elements.

16. The phase-locked loop of claim 11, further comprising:
first and second digital-to-analog converters providing respective first and second digital-to-analog control voltages responsive to control codes supplied by the controller;
a first plurality of switches configured to select one of the first digital-to-analog control voltage, a fixed high voltage and a fixed low voltage to connect to corresponding ones of a first one of the two or more banks of gain elements responsive to corresponding control signals from the controller;
a second plurality of switches configured to select one of the second digital-to-analog control voltage, the fixed high voltage and the fixed low voltage to connect to corresponding ones of a second one of the two or more banks of gain elements responsive to corresponding control signals from the controller;

wherein the controller is configured to adjust the control signals such that one of the gain elements in the first bank is supplied with the first digital-to-analog control voltage, one of the gain elements in the second bank is supplied with the second digital-to-analog control voltage, and remaining ones of the gain elements in the first bank and the second bank are supplied with the fixed high voltage or the fixed low voltage.

17. The phase-locked loop of claim 16, wherein at least one of the first and second digital-to-analog converters comprises a transfer function such that at least a top two control codes produce a same maximum voltage and at least a bottom two control codes produce a same minimum voltage.

18. The phase-locked loop of claim 11, wherein the oscillator comprises two or more digitally switched high-Q capacitors for coarse band tuning of the magnitude of the variable capacitance, the plurality of gain elements comprising a plurality of digitally controlled varactors providing for continuous tuning of the magnitude of the variable capacitance within a given coarse band.

* * * * *